United States Patent
Kang et al.

(10) Patent No.: US 12,040,318 B2
(45) Date of Patent: Jul. 16, 2024

(54) DISPLAY DEVICE AND MANUFACTURING METHOD THEREFOR

(71) Applicant: Samsung Display Co., Ltd., Yongin-si (KR)

(72) Inventors: Jong Hyuk Kang, Yongin-si (KR); Hyun Min Cho, Yongin-si (KR); Dae Hyun Kim, Yongin-si (KR); Hyun Deok Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 398 days.

(21) Appl. No.: 17/297,346

(22) PCT Filed: Feb. 20, 2019

(86) PCT No.: PCT/KR2019/002071
§ 371 (c)(1),
(2) Date: May 26, 2021

(87) PCT Pub. No.: WO2020/111391
PCT Pub. Date: Jun. 4, 2020

(65) Prior Publication Data
US 2022/0052031 A1 Feb. 17, 2022

(30) Foreign Application Priority Data
Nov. 27, 2018 (KR) .................. 10-2018-0148632

(51) Int. Cl.
*H01L 23/00* (2006.01)
*H01L 25/16* (2023.01)
(Continued)

(52) U.S. Cl.
CPC ............ *H01L 25/167* (2013.01); *H01L 24/24* (2013.01); *H01L 24/82* (2013.01); *H01L 33/24* (2013.01);
(Continued)

(58) Field of Classification Search
CPC ......... H01L 24/24; H01L 24/82; H01L 24/97; H01L 25/167; H01L 25/50;
(Continued)

(56) References Cited

U.S. PATENT DOCUMENTS 7,727,788 B2   6/2010   Han et al.
8,487,320 B2 * 7/2013   Zhu .................... H01L 33/02
                                                  257/79

(Continued)

FOREIGN PATENT DOCUMENTS

CN    108022936 A    5/2018
CN    108269520 A    7/2018
(Continued)

*Primary Examiner* — Nikolay K Yushin
(74) *Attorney, Agent, or Firm* — Lewis Roca Rothgerber Christie LLP

(57) ABSTRACT

A display device may include: a substrate including a display area and a non-display area; and pixels provided on the display area, and each including sub-pixels each including an emission area and a non-emission area. Each sub-pixel may include a pixel circuit layer including at least one transistor, and a display element layer including at least one light emitting element configured to emit light and connected to the transistor. The display element layer may include: a first electrode and a second electrode spaced apart from each other with the light emitting element interposed therebetween; the light emitting element connected between the first and second electrodes; and a planarization layer provided on the pixel circuit layer, and coming into contact with at least a portion of each of opposite ends of the light emitting element. The planarization layer may overlap with each of the first electrode and the second electrode.

20 Claims, 19 Drawing Sheets

(51) Int. Cl.
    *H01L 33/24* (2010.01)
    *H01L 33/38* (2010.01)
    *H01L 33/62* (2010.01)

(52) U.S. Cl.
    CPC .............. *H01L 33/38* (2013.01); *H01L 33/62* (2013.01); *H01L 2224/24147* (2013.01); *H01L 2224/24991* (2013.01); *H01L 2224/82007* (2013.01); *H01L 2224/82101* (2013.01)

(58) Field of Classification Search
    CPC ..... H01L 25/0753; H01L 33/24; H01L 33/38; H01L 33/62; H01L 33/32; H01L 2224/24147; H01L 2224/24991; H01L 2224/82007; H01L 2224/82101; H01L 23/00; H01L 23/60; H01L 23/4985; H01L 23/53287; H01L 25/16; H01L 25/075; H01L 27/1214; H01L 27/12; H01L 27/156; H01L 27/15; H01L 33/20; H01L 33/44; H01L 33/005; H01L 2933/0066; H01L 2933/0016; H01L 2933/0025
    See application file for complete search history.

(56) References Cited

U.S. PATENT DOCUMENTS

| | | | |
|---|---|---|---|
| 8,508,124 B2 | 8/2013 | Min | |
| 9,059,114 B2 | 6/2015 | Do et al. | |
| 9,329,433 B2 | 5/2016 | Negishi et al. | |
| 9,607,548 B2 | 3/2017 | Kimura et al. | |
| 10,026,777 B2 | 7/2018 | Kang et al. | |
| 10,090,335 B2 | 10/2018 | Kang et al. | |
| 10,170,525 B2 | 1/2019 | Lee et al. | |
| 10,325,936 B2 | 6/2019 | Kang et al. | |
| 10,361,391 B2 | 7/2019 | Kim et al. | |
| 10,593,743 B2* | 3/2020 | Son | H10K 59/00 |
| 10,651,264 B2 | 5/2020 | An et al. | |
| 2011/0297966 A1* | 12/2011 | Zhu | H01L 33/20 |
| | | | 977/932 |
| 2018/0175009 A1 | 6/2018 | Kim et al. | |
| 2018/0175106 A1 | 6/2018 | Kim et al. | |
| 2018/0190747 A1* | 7/2018 | Son | G06F 3/1446 |

FOREIGN PATENT DOCUMENTS

| | | |
|---|---|---|
| EP | 3270413 A1 | 1/2018 |
| EP | 3270424 A1 | 1/2018 |
| EP | 3316301 A1 | 5/2018 |
| EP | 3316302 A1 | 5/2018 |
| KR | 10-0763894 B1 | 10/2007 |
| KR | 10-2012-0138805 A | 12/2012 |
| KR | 10-1209449 B1 | 12/2012 |
| KR | 10-2015-0077328 A | 7/2015 |
| KR | 10-1628345 B1 | 6/2016 |
| KR | 10-1674052 B1 | 11/2016 |
| KR | 10-2017-0055587 A | 5/2017 |
| KR | 10-2018-0046491 A | 5/2018 |
| KR | 10-2018-0046494 A | 5/2018 |
| KR | 10-2018-0071465 A | 6/2018 |
| KR | 10-2018-0072909 A | 7/2018 |
| KR | 10-2018-0079011 A | 7/2018 |
| KR | 10-1881083 B1 | 7/2018 |

\* cited by examiner

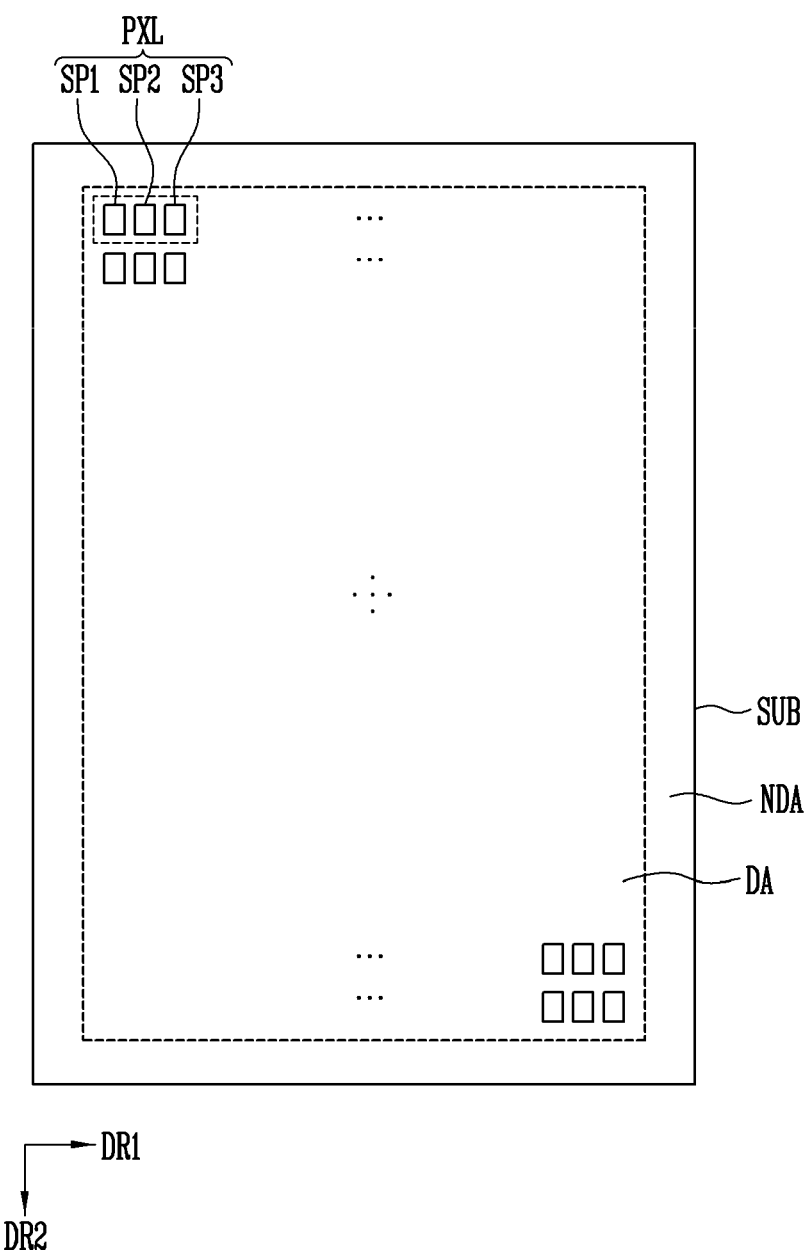

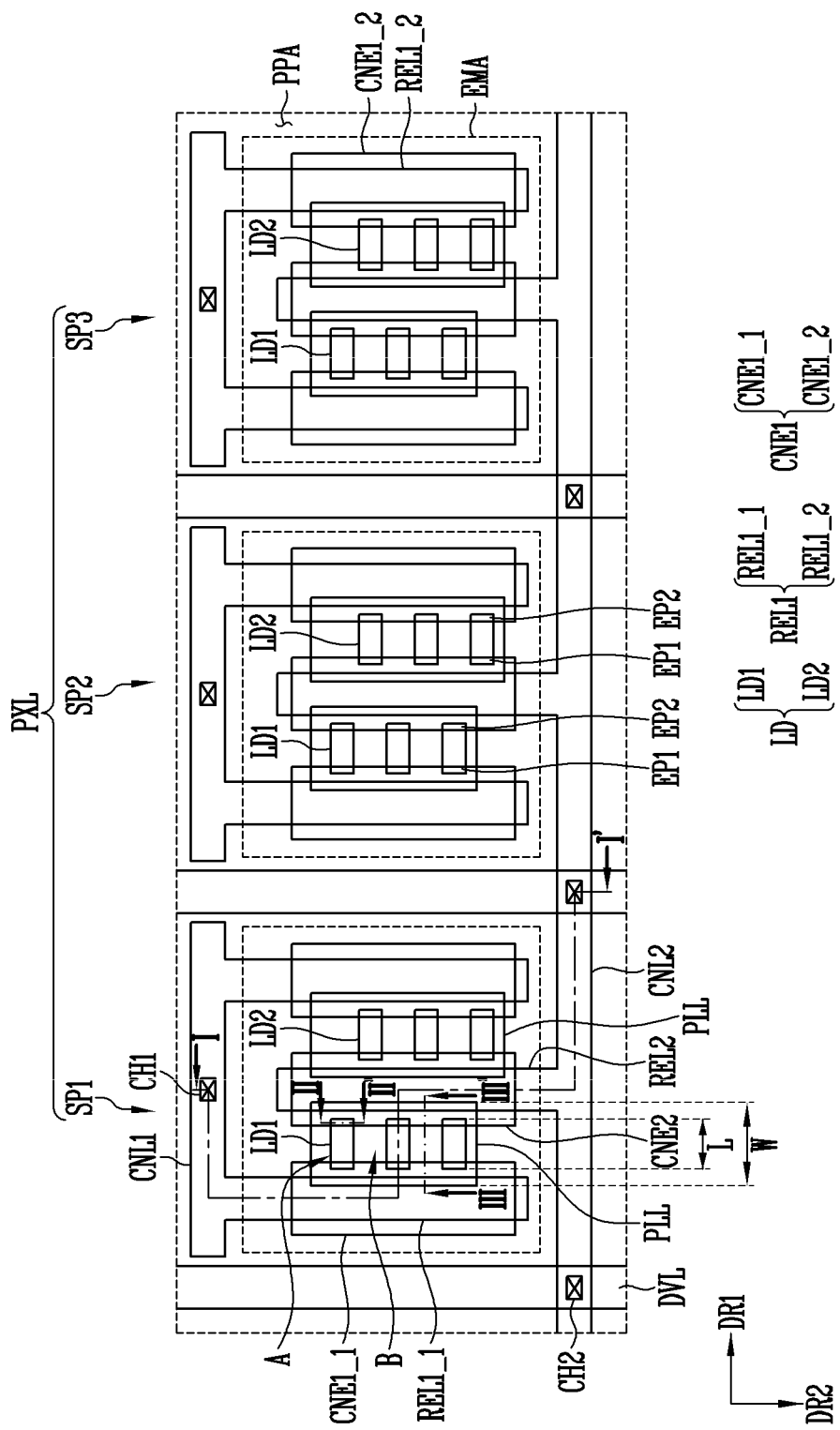

DISPLAY DEVICE AND MANUFACTURING METHOD THEREFOR

CROSS-REFERENCE TO RELATED APPLICATIONS

This application is a U.S. National Phase Patent Application of Korean International Application No. PCT/KR2019/002071 filed on Feb. 20, 2019, which claims priority to Korean Patent Application No. 10-2018-0148632 filed on Nov. 27, 2018, the entire content of all of which is incorporated herein by reference.

FIELD

Various embodiments of the present disclosure relate to a display device and a method of fabricating the display device.

BACKGROUND

A light emitting diode may have relatively satisfactory durability even under poor environmental conditions, and have excellent performances in terms of lifetime and luminance.

To apply the LED to a lighting device, a display device, or the like, there is a need to connect the LED to an electrode so that the voltage of the power supply may be applied to the LED. With regard to application purposes of the LED, a method of reducing space needed for the electrode, or a method of fabricating the LED, various researches on arrangement relationship between the LED and the electrode have been conducted.

SUMMARY

Various embodiments of the present disclosure are directed to a display device capable of minimizing contact failure of a subminiature light emitting element and thus enhancing the light output efficiency of the light emitting element, and a method of fabricating the display device.

A display device in accordance with an embodiment of the present disclosure may include: a substrate including a display area and a non-display area; and a plurality of pixels provided on the display area, and each comprising a plurality of sub-pixels each including an emission area and a non-emission area. Each sub-pixel may include a pixel circuit layer including at least one transistor, and a display element layer including at least one light emitting element configured to emit light and connected to the transistor.

In an embodiment, the display element layer may include: a first electrode and a second electrode spaced apart from each other with the light emitting element interposed therebetween; the light emitting element connected between the first electrode and the second electrode; and a planarization layer provided on the pixel circuit layer, and coming into contact with at least a portion of each of opposite ends of the light emitting element. The planarization layer may overlap with each of the first electrode and the second electrode, in a plan view.

In an embodiment, a width of the planarization layer may be equal to or greater than a length of the light emitting element.

In an embodiment, a height of the planarization layer may be less than a diameter of the light emitting element, in a sectional view.

In an embodiment, the display element layer may further include: a first insulating layer configured to enclose a portion of each of the first and the second electrodes; and a support layer provided on the first insulating layer and configured to support the light emitting element. Here, the support layer may be provided in a form of being charged between a lower surface of the light emitting element and the first insulating layer on the pixel circuit layer that faces the lower surface.

In an embodiment, the planarization layer and the support layer may be integrally provided, and include identical material. Here, the planarization layer and the support layer each comprise an organic insulating layer including an organic material.

In an embodiment, the display element layer may further include: a second insulating layer provided on an upper surface of the light emitting element; a first contact electrode configured to connect any one end of the opposite ends of the light emitting element with the first electrode; and a second contact electrode configured to connect a remaining end of the opposite ends of the light emitting element with the second electrode.

In an embodiment, each of the first contact electrode and the second contact electrode may be provided on the planarization layer and may overlap with the planarization layer.

In an embodiment, the first contact electrode and the second contact electrode may be provided on an identical layer, and be spaced apart from each other on the second insulating layer and electrically separated from each other.

In an embodiment, the display element layer may further include: a third insulating layer provided on the first contact electrode; and a fourth insulating layer provided on the second contact electrode. The first contact electrode and the second contact electrode may be provided on different layers and electrically separated from each other.

In an embodiment, the display element layer may further include a capping layer respectively provided between the first electrode and the first contact electrode and between the second electrode and the second contact electrode.

In an embodiment, the first insulating layer may expose a portion of the capping layer on the first electrode so that the first electrode is electrically connected with the first contact electrode, and the first insulating layer may expose a portion of the capping layer on the second electrode so that the second electrode is electrically connected with the second contact electrode.

In an embodiment, the light emitting element may include a light emitting diode having a shape of a cylinder having a micrometer scale or a nanometer scale.

A method of fabricating a display device in accordance with an embodiment of the present disclosure may include: providing a substrate comprising a plurality of sub-pixels each including an emission area and a non-emission area; and forming, on the substrate, a display element layer configured to emit light from the emission area of each of the sub-pixels.

In an embodiment, the forming the display element layer may include: forming first and second electrodes spaced apart from each other in the emission area of each of the sub-pixels; forming a first insulating material layer on the first and the second electrodes; aligning a plurality of light emitting elements between the first and the second electrodes by respectively applying corresponding alignment voltages to the first and the second electrodes; forming an insulating pattern for covering each of the light emitting element and a portion of the first insulating material layer by depositing a second insulating material layer on an overall surface of the substrate and then patterning the second insulating material layer; forming, by removing a portion of the insulating pattern through an ashing process, a planarization layer overlapping with the light emitting element and disposed on the first insulating material layer; forming a second insulating layer for covering a portion of an upper surface of the light emitting element; and forming a first contact electrode and a second contact electrode on the substrate including the second insulating layer.

In an embodiment, the method may include, before forming the first contact electrode and the second contact electrode, forming a first insulating layer by removing a portion of the first insulating material layer corresponding to the first electrode to expose the first electrode and removing a portion of the first insulating material layer corresponding to the second electrode to expose the second electrode.

In an embodiment, the planarization layer may overlap with each of the first electrode, the second electrode, and the light emitting elements, in a plan view.

In an embodiment, forming the planarization layer may include forming a support layer having a shape to be charged between a lower surface of the light emitting elements and the first insulating material layer. The planarization layer and the support layer each may be an organic insulating layer including an organic material.

Various embodiments of the present disclosure may provide a display device capable of minimizing contact failure of a light emitting element and thus enhancing the light output efficiency of the light emitting element, and a method of fabricating the display device.

The effects of the present disclosure are not limited by the foregoing, and other various effects are anticipated herein.

BRIEF DESCRIPTION OF THE DRAWINGS

FIG. 2 illustrates a display device in accordance with an embodiment of the present disclosure, and particularly, is a schematic plan view illustrating a display device using the light emitting element illustrated in FIG. 1A as a light emitting source.

FIGS. 4A and 4B each is a plan view schematically illustrating first to third sub-pixels included in one of the pixels illustrated in FIG. 2.

DETAILED DESCRIPTION

Figure 1A:
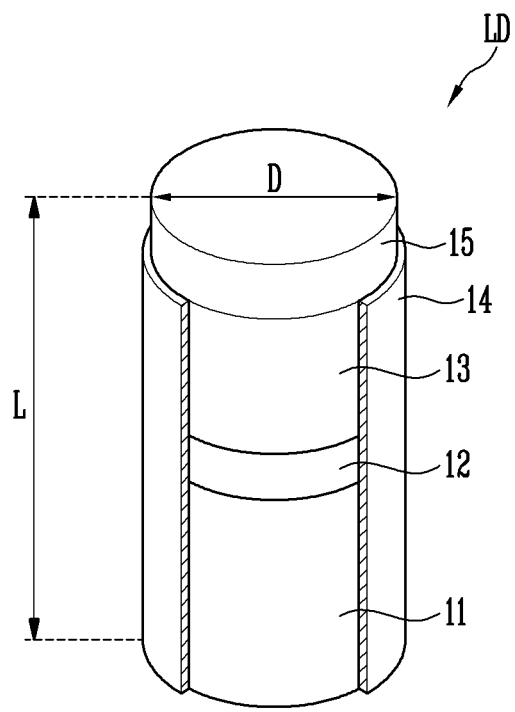
FIGS. 1A and 1B each is a perspective view schematically illustrating a light emitting element in accordance with an embodiment of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. Also, when a first part such as a layer, a film, a region, or a plate is under a second part, the first part may be not only directly under the second part but a third part may intervene between them.

Embodiments and required details of the present disclosure are described with reference to the accompanying drawings in order to describe the present disclosure in detail so that those having ordinary knowledge in the technical field to which the present disclosure pertains can easily practice the present disclosure.

Figure 1B:
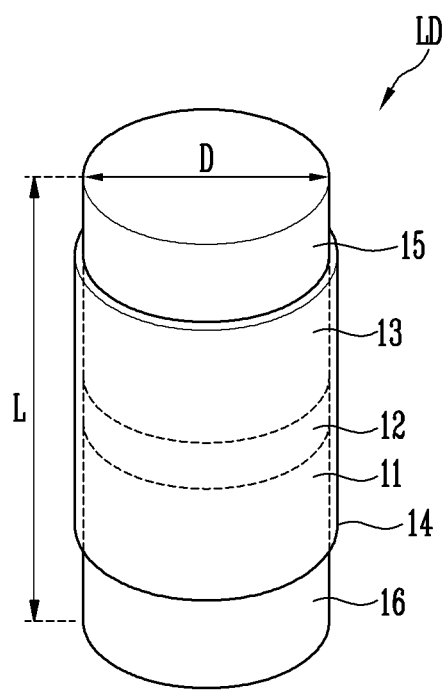

FIGS. 1A and 1B each is a perspective view schematically illustrating a light emitting element in accordance with an embodiment of the present disclosure. Although FIGS. 1A and 1B illustrate cylindrical light emitting elements, the present disclosure is not limited thereto.

Referring to FIGS. 1A and 1B, a light emitting element LD in accordance with an embodiment of the present disclosure may include a first semiconductor layer 11 (or a first conductive semiconductor layer), a second semiconductor layer 13 (or a second conductive semiconductor layer), and an active layer 12 interposed between the first and second conductive semiconductor layers 11 and 13. For example, the light emitting element LD may be implemented as an emission stack formed by successively stacking the first conductive semiconductor layer 11, the active layer 12, and the second conductive semiconductor layer 13.

In an embodiment of the present disclosure, the light emitting element LD may be formed in a rod-like shape extending in one direction. If the direction in which the light emitting element LD extends is defined as a longitudinal direction (L), the light emitting element LD may have a first end and a second end in the extension direction. One of the first and second conductive semiconductor layers 11 and 13 may be disposed on the first end, and the other of the first and second conductive semiconductor layers 11 and 13 may be disposed on the second end.

Although the light emitting element LD may be provided in the form of a cylinder, the present disclosure is not limited thereto. The light emitting element LD may include a rod-like shape or a bar-like shape extending in the longitudinal direction L (i.e., to have an aspect ratio greater than 1). For example, the length L of the light emitting element LD in a longitudinal direction may be greater than a diameter D thereof (or a width of the cross-section thereof). The light emitting element LD may include a light emitting diode fabricated to have a subminiature size, e.g., with a length L and/or a diameter D corresponding to the micrometer scale or the nanometer scale. The diameter D of the light emitting element LD may approximately range from 0.5 μm to 500 μm, and the length L thereof may approximately range from 1 μm to 1000 μm. However, the size of the light emitting element LD is not limited to this, and the size of the light emitting element LD may be changed to meet requirements of a lighting device or a self-emissive display device to which the light emitting element LD is applied.

The first conductive semiconductor layer 11 may include, for example, at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn. The material forming the first conductive semiconductor layer 11 is not limited to this, and the first conductive semiconductor layer 11 may be formed of various other materials.

The active layer 12 may be formed on the first conductive semiconductor layer 11, and May have a single or multiple quantum well structure. In an embodiment of the present disclosure, a cladding layer (not illustrated) doped with a conductive dopant may be formed on and/or under the active layer 12. For example, the cladding layer may be formed of an AlGaN layer or an InAlGaN layer. In addition, material such as AlGaN or AlInGaN may be employed to form the active layer 12.

If an electric field having a predetermined voltage or more is applied to the opposite ends of the light emitting element LD, the light emitting element LD emits light by recombining of electron-hole pairs in the active layer 12.

The second conductive semiconductor layer 13 may be provided on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg. The material forming the second conductive semiconductor layer 13 is not limited to this, and the second conductive semiconductor layer 13 may be formed of various other materials.

In an embodiment of the present disclosure, the light emitting element LD may further include one electrode layer 15 disposed on the second conductive semiconductor layer 13, as illustrated in FIG. 1A, in addition to including the first conductive semiconductor layer 11, the active layer 12, and the second conductive semiconductor layer 13. Furthermore, in an embodiment, as shown in FIG. 1B, the light emitting element LD may further include another electrode layer 16 disposed on one end of the first conductive semiconductor layer 11, in addition to including the electrode layer 15.

Although each of the electrode layers 15 and 16 may be formed of an ohmic contact electrode, the present disclosure is not limited thereto. The electrode layers 15 and 16 may include metal or a metal oxide. For example, chrome (Cr), titanium (Ti), aluminum (Al), gold (Au), nickel (Ni), ITO, and an oxide or alloy thereof may be used alone or in combination with each other. However, the present disclosure is not limited to this.

Materials included in the respective electrode layers 15 and 16 may be to the same as or different from each other. The electrode layers 15 and 16 may be substantially transparent or semitransparent. Therefore, light generated from the light emitting element LD may pass through the electrode layers 15 and 16 and then be emitted outside the light emitting element LD.

In an embodiment of the present disclosure, the light emitting element LD may further include an insulating film 14. However, in some embodiments of the present disclosure, the insulating film 14 may be omitted, or may be provided to cover only some of the first conductive semiconductor layer 11, the active layer 12, and the second conductive semiconductor layer 13.

As illustrated in FIG. 1A, the insulating film 14 may be provided on a portion of the light emitting element LD other than one of opposite ends of the light emitting element LD. In this case, the insulating film 14 may expose only the one electrode layer 15 disposed on one end of the second conductive semiconductor layer 13 of the light emitting element LD, and enclose the overall side surfaces of the components other than the electrode layer 15. Here, the insulating film 14 may allow at least the opposite ends (e.g., end surfaces) of the light emitting element LD to be exposed to the outside. For example, the insulating film 14 may allow not only the electrode layer 15 disposed on one end of the second conductive semiconductor layer 13 but also one end of the first conductive semiconductor layer 11 to be exposed to the outside.

In an embodiment, as illustrated in FIG. 1B, in the case where the electrode layers 15 and 16 are disposed on the respective opposite ends of the light emitting element LD, the insulating film 14 may allow at least a portion of each of the electrode layers 15 and 16 to be exposed to the outside. Alternatively, in an embodiment, the insulating film 14 may not be provided.

In an embodiment of the present disclosure, the insulating film 14 may include transparent insulating material. For example, the insulating film 14 may include at least one insulating material selected from the group consisting of $SiO_2$, $Si_3N_4$, $Al_2O_3$, and $TiO_2$, but the present disclosure is not limited thereto. In other words, various materials having insulating properties may be employed.

If the insulating film 14 is provided on the light emitting element LD, the active layer 12 of the light emitting element LD may be prevented from short-circuiting with a first electrode and/or a second electrode, which is not illustrated.

Thanks to the insulating film 14, occurrence of a defect on the surface of the light emitting element LD may be minimized, whereby the lifetime and efficiency of the light emitting element LD may be improved. In the case where a plurality of light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated through a surface treatment process.

FIG. 2 illustrates a display device in accordance with an embodiment of the present disclosure, and particularly, is a schematic plan view illustrating a display device using the light emitting element illustrated in FIG. 1A as a light emitting source.

For the sake of explanation, FIG. 2 schematically illustrates the structure of the display device, focused on a display area on which an image is displayed. In some embodiments, although not illustrated, at least one driving circuit (e.g., a scan driver and a data driver) and/or a plurality of lines may be further provided in the display device.

Referring to FIGS. 1A and 2, the display device in accordance with the embodiment of the present disclosure may include a substrate SUB, a plurality of pixels PXL provided on the substrate SUB and each including at least one light emitting element LD, a driver (not illustrated) provided on the substrate SUB and configured to drive the pixels PXL, and a line component (not illustrated) provided to connect the pixels PXL with the driver.

The display device may be classified into a passive-matrix type display device and an active-matrix type display device according to a method of driving the light emitting element LD. For example, in the case where the display device is implemented as an active matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the present disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device in such a way as to enclose the display area DA. The locations of the display area DA and the non-display area NDA are not limited to this, and the locations thereof may be changed.

The display area DA may be an area in which the pixels PXL for displaying an image are provided. The non-display area NDA may be an area in which the driver for driving the pixels PXL and some of the line component for coupling the pixels PXL to the driver are provided.

The display area DA may have various shapes. For example, the display area DA may be provided in various forms such as a closed polygon including sides formed of linear (e.g., straight) lines, a circle, an ellipse or the like including a side formed of a curved line, and a semicircle, a semi-ellipse or the like including sides formed of a linear (e.g., straight) line and a curved line.

The non-display area NDA may be provided on at least one side of the display area DA. In an embodiment of the present disclosure, the non-display area NDA may enclose the perimeter of the display area DA.

The substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

The pixels PXL may be disposed in the display area DA on the substrate SUB. Each of the pixels PXL refers to a smallest unit for displaying an image, and a plurality of pixels PXL may be provided.

Each of the pixels PXL may include the light emitting element LD configured to be driven in response to a corresponding scan signal and a corresponding data signal. The light emitting element LD may have a small size corresponding to the nanometer scale or the micrometer scale, and be connected in parallel to light emitting elements disposed adjacent thereto. The light emitting element LD may form a light source of the corresponding pixel PXL.

Furthermore, each of the pixels PXL may include a plurality of sub-pixels. For example, each pixel PXL may include a first sub-pixel SP1, a second sub-pixel SP2, and a third sub-pixel SP3. In an embodiment, the first, second, and third sub-pixels SP1, SP2, and SP3 may emit different colors of light. For instance, the first sub-pixel SP1 may be a red sub-pixel configured to emit red light, the second sub-pixel SP2 may be a green sub-pixel configured to emit green light, and the third sub-pixel SP3 may be a blue sub-pixel configured to emit blue light. However, the colors, the types and/or the number of sub-pixels forming each pixel PXL are not particularly limited. For example, the color of light which is emitted from each sub-pixel may be changed in various ways. Although in FIG. 2 there is illustrated an embodiment where the pixels PXL are arranged in the display area DA in a stripe shape and/or a matrix shape, the present disclosure is not limited thereto. For instance, the display area DA may have various well-known pixel arrangement shapes.

The driver may provide a signal to each pixel PXL through the line component and thus control the operation of the pixel PXL. In FIG. 2, the line component is omitted for the convenience sake of explanation.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Figure 3A:
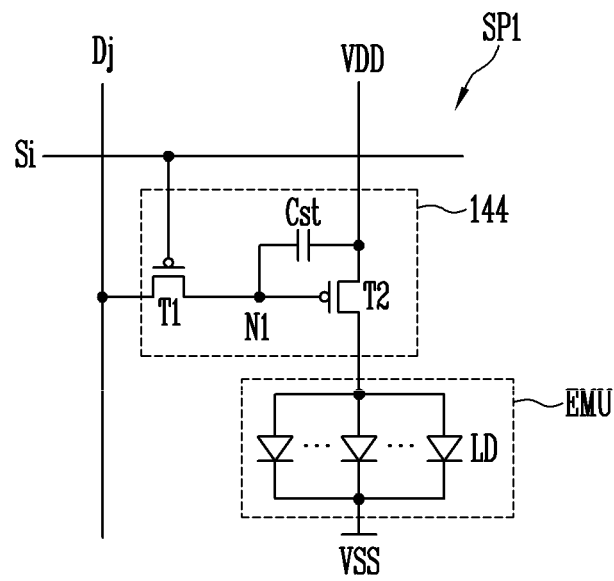
FIGS. 3A to 3C are circuit diagrams illustrating examples of a first sub-pixel of first to third sub-pixels of the display device of FIG. 2 in accordance with various embodiments.
Figure 3B:
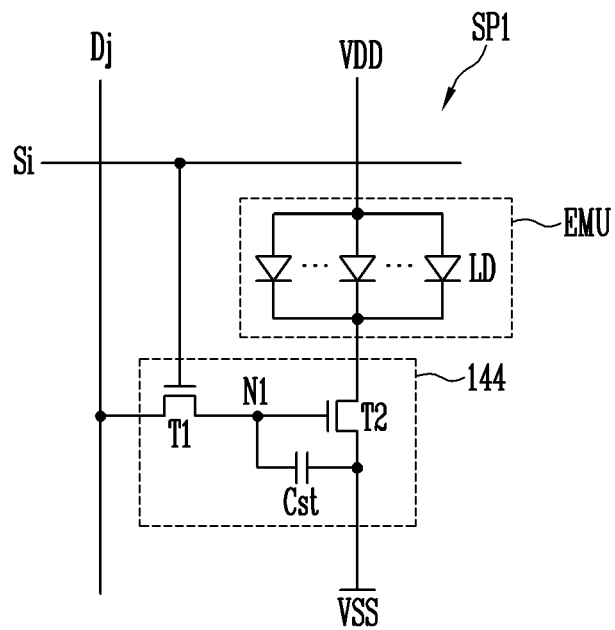
Figure 3C:
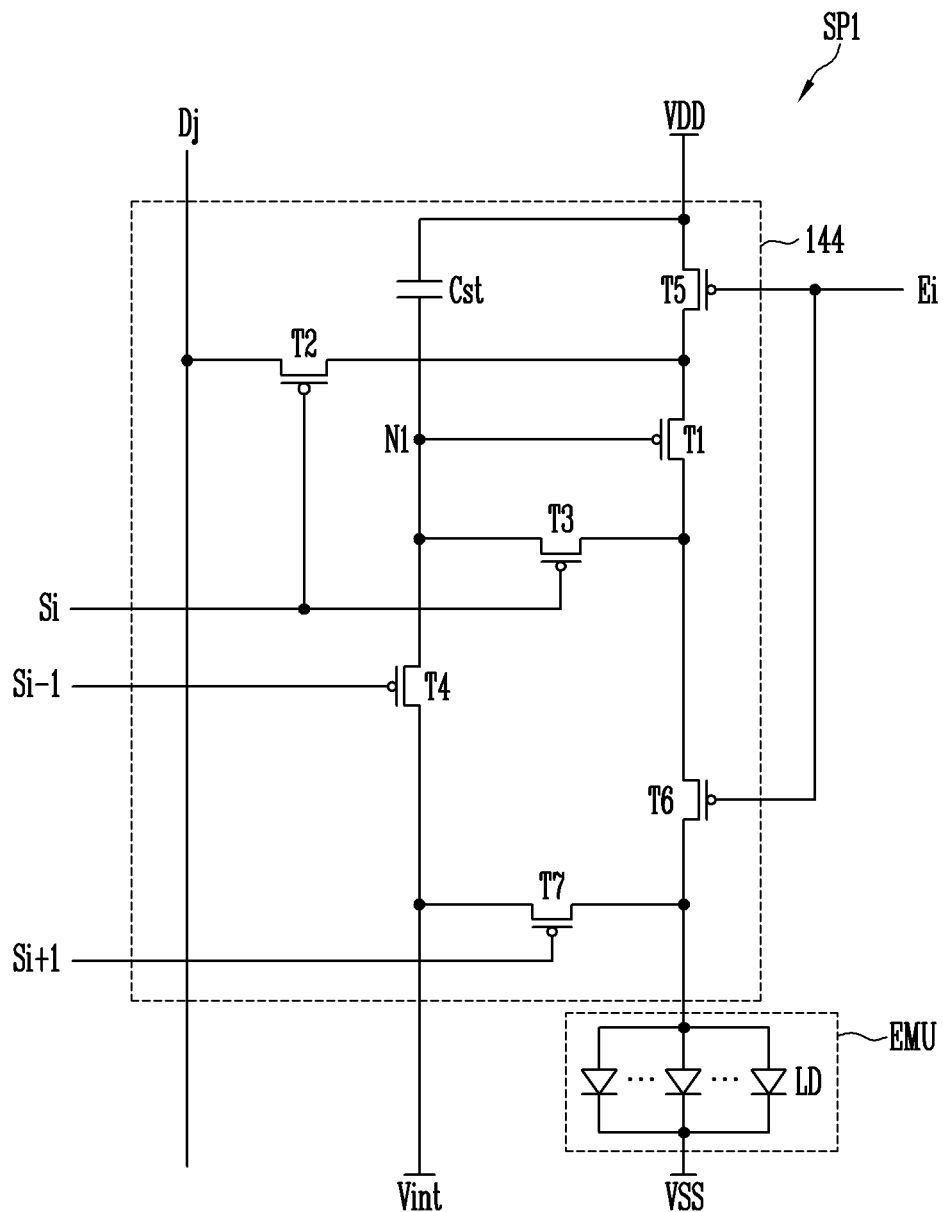

FIGS. 3A to 3C are circuit diagrams illustrating examples of a first sub-pixel of first to third sub-pixels of the display device of FIG. 2 in accordance with various embodiments.

Referring to FIGS. 3A to 3C, each of the first to third sub-pixels may be configured of an active pixel. However, the type, the configuration, and/or the driving method of each of the first to third sub-pixels is not particularly limited. For example, each of the first to third sub-pixels may be configured of a pixel of a passive or active display device which can have various known structures.

Furthermore, referring to FIGS. 3A to 3C, the first to third sub-pixels may have substantially the same structure or similar structures. Hereinafter, for convenience sake, the first sub-pixel of the first to third sub-pixels will be described as a representative example.

Referring to FIGS. 1A, 2, and 3A, the first sub-pixel SP1 may include an emission circuit (or emission unit) EMU configured to generate light having a luminance corresponding to a data signal, and a pixel driving circuit 144 configured to drive the emission circuit EMU.

In an embodiment, the emission circuit EMU may include a plurality of light emitting elements LD connected in parallel between a power line to which a first driving power supply VDD is to be applied and a power line to which a second driving power supply VSS is to be applied. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or more during an emission period of the first sub-pixel SP1. A first electrode (e.g., an anode electrode) of each of the light emitting elements LD may be connected to the first driving power supply VDD via the pixel driving circuit 144. A second electrode (e.g., a cathode electrode) of each of the light emitting elements LD may be connected to the second driving power supply VSS.

Each of the light emitting elements LD may emit light at a luminance corresponding to driving current which is controlled by the pixel driving circuit 144.

Although FIGS. 3A to 3C illustrate embodiments in which the light emitting elements LD are connected in parallel to each other in the same direction (e.g., a forward direction) between the power lines to which the first and second driving power supplies VDD and VSS are to be respectively applied, the present disclosure is not limited thereto. For example, in an embodiment, some of the light emitting elements LD may be connected in a forward direction between the power lines to which the first and second driving power supplies VDD and VSS are to be respectively applied, and the other light emitting elements LD may be connected in a reverse direction. One of the first and second driving power supplies VDD and VSS may be supplied in the form of alternating voltage. In this case, the light emitting elements LD may alternately emit light by or from the same connection direction groups. Alternatively, in an embodiment, the first sub-pixel SP1 may include only a single light emitting element LD.

In an embodiment of the present disclosure, the pixel driving circuit 144 may include first and second transistors T1 and T2, and a storage capacitor Cst. The structure of the pixel driving circuit 144 is not limited to that of the embodiment illustrated in FIG. 3A.

A first electrode of the first transistor T1 (switching transistor) is connected to a data line Dj, and a second electrode thereof is connected to a first node N1. Here, the first electrode and the second electrode of the first transistor T1 may be different electrodes. For example, if the first electrode is a source electrode, the second electrode is a drain electrode. A gate electrode of the first transistor T1 is connected to the scan line Si.

When a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 may be charged to the storage capacitor Cst.

A first electrode of the second transistor T2 (driving transistor) is connected to the first driving power supply VDD, and a second electrode thereof is electrically connected to the first electrode of each of the light emitting elements LD. A gate electrode of the second transistor T2 is connected to the first node N1. As such, the second transistor T2 may control the amount of driving current to be supplied to the light emitting elements LD in response to the voltage of the first node N1.

One electrode of the storage capacitor Cst is connected to the first driving power supply VDD, and the other electrode thereof is connected to the first node N1. The storage capacitor Cst is charged with a voltage corresponding to a data signal supplied to the first node N1, and maintains the charged voltage until a data signal of a subsequent frame is supplied.

For the sake of explanation, FIG. 3A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the present disclosure is not limited thereto, and the structure of the pixel driving circuit 144 may be changed in various ways. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although FIG. 3A illustrates that the transistors, e.g., the first and second transistors T1 and T2, included in the pixel driving circuit 144 are formed of P-type transistors, the present disclosure is not limited to this. In other words, at least one of the first and second transistors T1 and T2 included in the pixel driving circuit 144 may be changed to an N-type transistor.

Referring to FIGS. 1A, 2, and 3B, the first and second transistors T1 and T2 in accordance with an embodiment of the present disclosure may be formed of N-type transistors. The configuration and operation of the pixel driving circuit 144 illustrated in FIG. 3B, other than a change in connection positions of some components due to a change in the type of transistor, are similar to those of the pixel driving circuit 144 of FIG. 3A. Therefore, detailed descriptions pertaining to this will be omitted.

In an embodiment of the present disclosure, the configuration of the pixel driving circuit 144 is not limited to the embodiments illustrated in FIGS. 3A and 3B. For example, the pixel driving circuit 144 may be configured in the same manner as that of an embodiment illustrated in FIG. 3C.

Referring to FIGS. 1A, 2, and 3C, the pixel driving circuit 144 may be connected to the scan line Si and the data line Dj of the first sub-pixel SP1. For example, if the first sub-pixel SP1 is disposed on an ith row and a jth column of the display area DA, the pixel driving circuit 144 of the first sub-pixel SP1 may be connected to an ith scan line Si and a jth data line Dj of the display area DA.

In an embodiment, the pixel driving circuit 144 may also be connected to at least one other scan line. For example, the first sub-pixel SP1 disposed on the ith row of the display area DA may be further connected to an i−1th scan line Si−1 and/or an i+1th scan line Si+1.

In an embodiment, the pixel driving circuit 144 may be connected not only to the first and second driving power supplies VDD and VSS but also to a third power supply. For example, the pixel driving circuit 144 may also be connected to an initialization power supply Vint.

The pixel driving circuit 144 may include first to seventh transistors T1 to T7, and a storage capacitor Cst.

A first electrode of the first transistor T1 (driving transistor), e.g., a source electrode, may be connected to the first driving power supply VDD via the fifth transistor T5, and a second electrode thereof, e.g., a drain electrode, may be connected to first ends of light emitting elements LD via the sixth transistor T6. A gate electrode of the first transistor T1 may be connected to a first node N1. The first transistor T1 may control driving current flowing between the first driving power supply VDD and the second driving power supply VSS via the light emitting elements LD in response to the voltage of the first node N1.

The second transistor T2 (switching transistor) may be connected between the jth data line Dj connected to the first sub-pixel SP1 and the source electrode of the first transistor T1. A gate electrode of the second transistor T2 is connected to the ith scan line Si connected to the first sub-pixel SP1. When a scan signal having a gate-on voltage (e.g., a low-level voltage) is supplied from the ith scan line Si, the second transistor T2 is turned on to electrically connect the jth data line Dj to the source electrode of the first transistor T1. Hence, if the second transistor T2 is turned on, a data signal supplied from the jth data line Dj may be transmitted to the first transistor T1.

The third transistor T3 is connected between the drain electrode of the first transistor T1 and the first node N1. A gate electrode of the third transistor T3 is connected to the ith scan line Si. When a scan signal having a gate-on voltage is supplied from the ith scan line Si, the third transistor T3 is turned on to electrically connect the drain electrode of the first transistor T1 to the first node N1. Therefore, when the third transistor T3 is turned on, the first transistor T1 may be connected in the form of a diode.

The fourth transistor T4 may be connected between the first node N1 and an initialization power supply Vint. A gate electrode of the fourth transistor T4 is connected to a previous scan line, e.g., an i−1th scan line Si−1. When a scan signal of a gate-on voltage is supplied to the i−1th scan line Si−1, the fourth transistor T4 is turned on so that the voltage of the initialization power supply Vint may be transmitted to the first node N1. Here, the initialization power supply Vint may have a voltage equal to or less than the minimum voltage of the data signal.

The fifth transistor T5 is connected between the first driving power supply VDD and the first transistor T1. A gate electrode of the fifth transistor T5 is connected to a corresponding emission control line, e.g., an ith emission control line Ei. The fifth transistor T5 may be turned off when an emission control signal having a gate-off voltage is supplied to the ith emission control line Ei, and may be turned on in other cases.

The sixth transistor T6 is connected between the first transistor T1 and first ends of the light emitting elements LD. A gate electrode of the sixth transistor T6 may be connected to the ith emission control line Ei. The sixth transistor T6 may be turned off when an emission control signal having a gate-off voltage is supplied to the ith emission control line Ei, and may be turned on in other cases.

The seventh transistor T7 is connected between the first ends of the light emitting elements LD and the initialization power supply Vint. A gate electrode of the seventh transistor T7 is connected to any one of scan lines of a subsequent stage, e.g., to the i+1th scan line Si+1. When a scan signal of a gate-on voltage is supplied to the i+1th scan line Si+1, the seventh transistor T7 may be turned on so that the voltage of the initialization power supply Vint may be supplied to the first ends of the light emitting elements LD.

The storage capacitor Cst is connected between the first driving power supply VDD and the first node N1. The storage capacitor Cst may store a voltage corresponding both to the data signal applied to the first node N1 during each frame period and to the threshold voltage of the first transistor T1.

For convenience sake, FIG. 3C illustrates that all of the first to seventh transistors T1 to T7 are formed of P-type transistors, but the present disclosure is not limited thereto. For example, at least one of the first to seventh transistors T1 to T7 included in the pixel driving circuit 144 may be formed of an N-type transistor, or all of the first to seventh transistors T1 to T7 may be formed of N-type transistors.

Figure 4A:
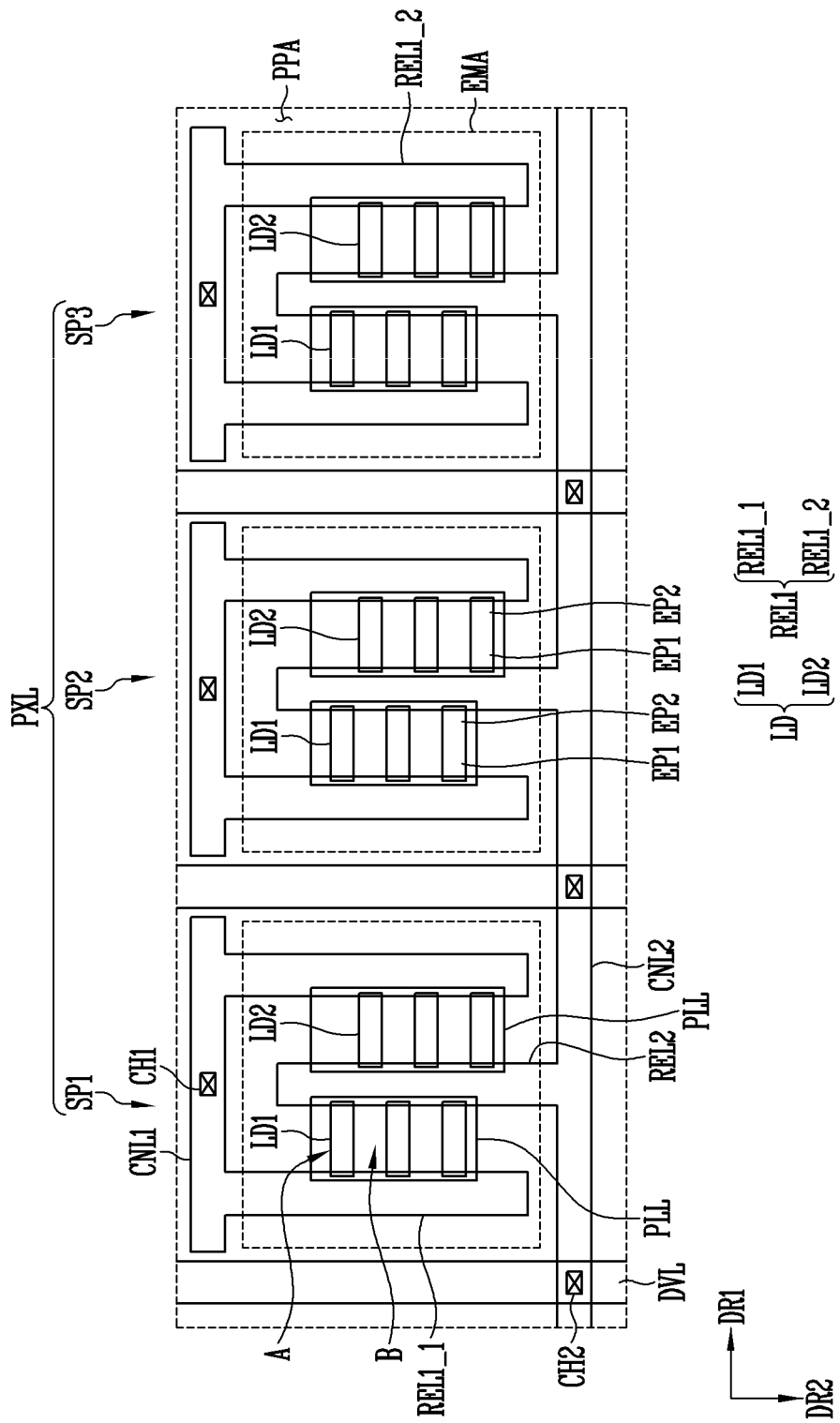
Figure 5:
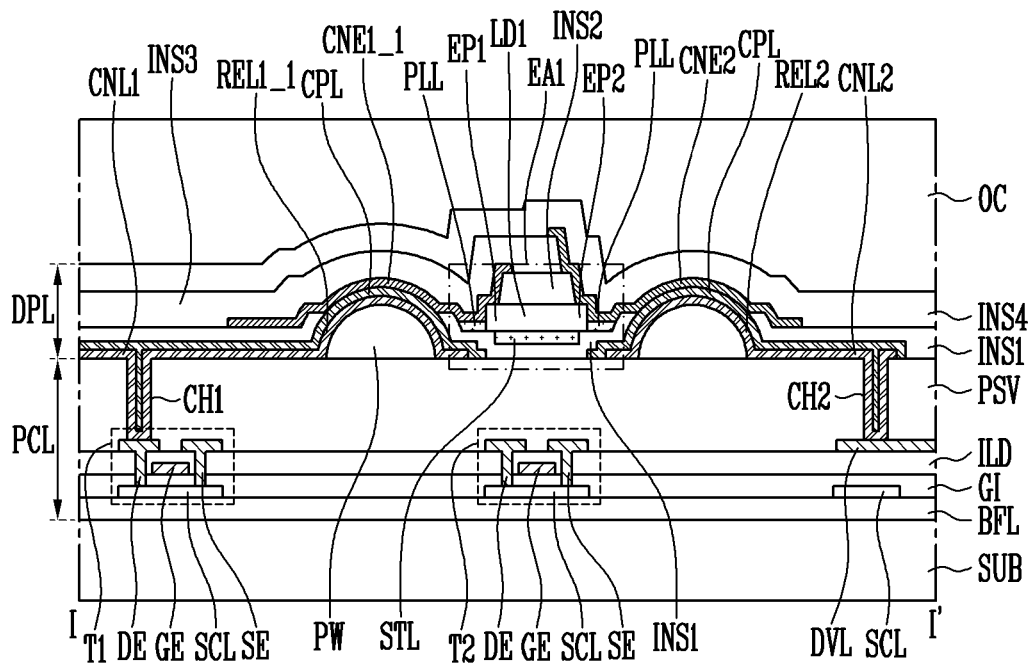
FIG. 5 is a sectional view taken along line I-I' of FIG. 4B.
Figure 6:
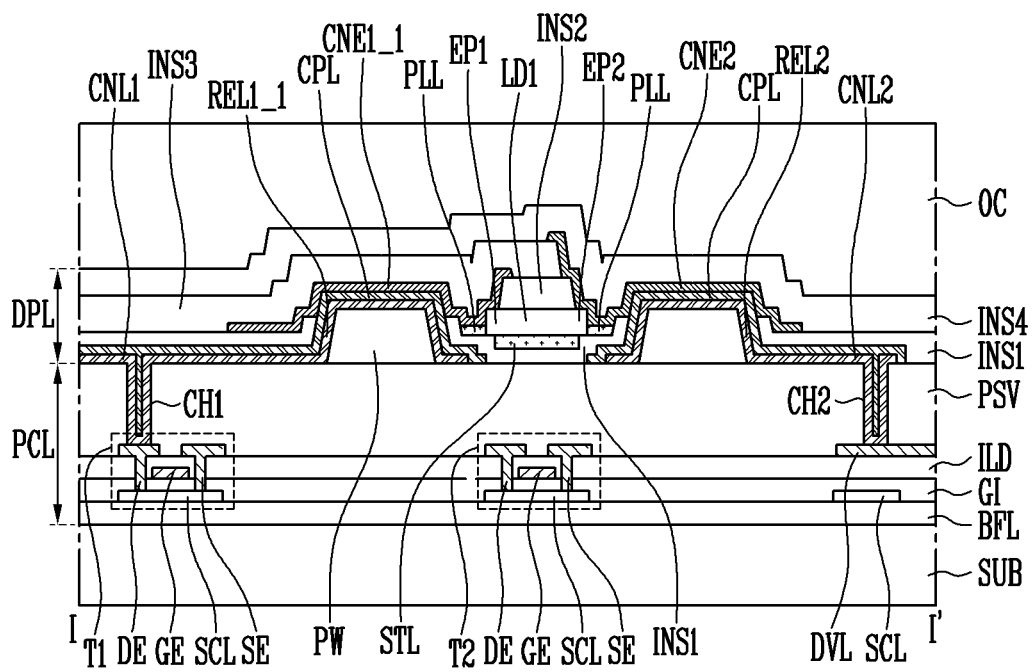
FIG. 6 illustrates another shape of a partition wall illustrated in FIG. 5, and is a sectional view taken along line I-I' of FIG. 4B.
Figure 7:
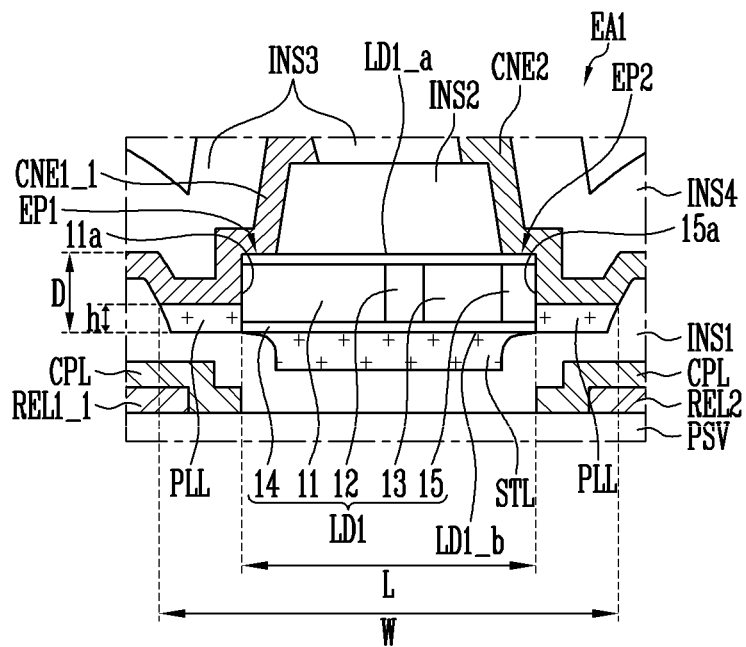
FIG. 7 is an enlarged sectional view of area EA1 of FIG. 5.
Figure 8:
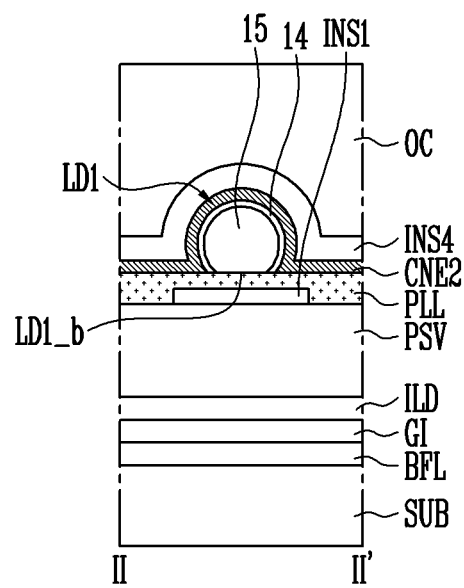
FIG. 8 is a sectional view illustrating a first light emitting element, taken along line II-II' of FIG. 4B.
Figure 9:
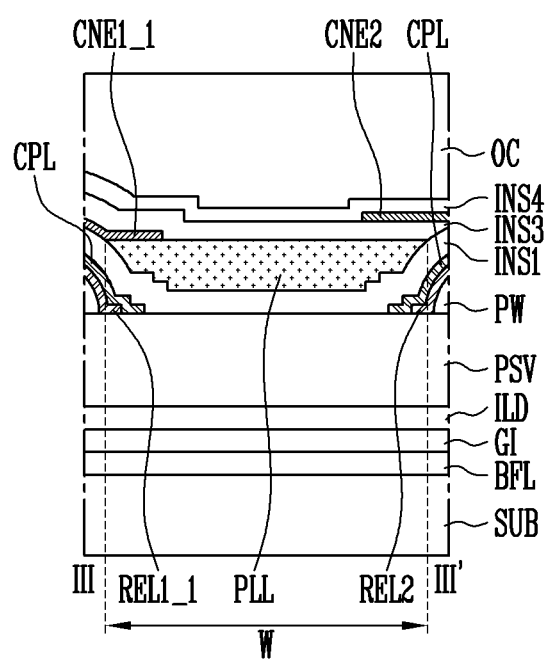
FIG. 9 is a sectional view taken along line III-III' of FIG. 4B.

FIGS. 4A and 4B each is a plan view schematically illustrating first to third sub-pixels included in one of the pixels illustrated in FIG. 2. FIG. 5 is a sectional view taken along line I-I' of FIG. 4B. FIG. 6 illustrates another shape of a partition wall illustrated in FIG. 5, and is a sectional view taken along line I-I' of FIG. 4B. FIG. 7 is an enlarged sectional view of area EA1 of FIG. 5. FIG. 8 is a sectional view illustrating a first light emitting element, taken along line II-II' of FIG. 4B. FIG. 9 is a sectional view taken along line III-III' of FIG. 4B.

Although for convenience sake FIGS. 4A and 4B illustrate that a plurality of light emitting elements provided in each sub-pixel are aligned in a horizontal direction, the alignment of the light emitting elements is not limited thereto. For example, at least some of the light emitting elements may be aligned in a direction intersecting with the horizontal direction.

Furthermore, for the sake of explanation, illustration of transistors connected to the light emitting elements, and signal lines connected to the transistors has been omitted in FIGS. 4A and 4B.

Moreover, although FIGS. 4A, and 4B to 9 illustrate a simplified structure of one pixel, e.g., showing that each electrode has only a single electrode layer, and each insulating layer has only a single insulating layer, the present disclosure is not limited thereto.

Referring to FIGS. 1A to 9, the display device in accordance with an embodiment of the present disclosure may include a substrate SUB on which a plurality of pixels PXL are provided.

Each of the pixels PXL may include a first sub-pixel SP1, a second sub-pixel SP2, and a third sub-pixel SP3 which are provided on the substrate SUB. In an embodiment of the present disclosure, the first sub-pixel SP1 may be a red sub-pixel, the second sub-pixel SP2 may be a green sub-pixel, and the third sub-pixel SP3 may be a blue sub-pixel. However, the present disclosure is not limited thereto. In an embodiment, the first sub-pixel SP1 may be a green sub-pixel or a blue sub-pixel, the second sub-pixel SP2 may be a blue sub-pixel or a red sub-pixel, and the third sub-pixel SP3 may be a red sub-pixel or a green sub-pixel.

Each of the first to third sub-pixels SP1 to SP3 may include an emission area EMA configured to emit light, and a peripheral area PPA disposed around a perimeter of the emission area EMA. The emission area EMA may refer to an area from which light is emitted, and the peripheral area PPA may refer to an area from which the light is not emitted. In an embodiment of the present disclosure, a pixel area of each of the first to third sub-pixels SP1 to SP3 may include an emission area EMA and a peripheral area PPA of the corresponding sub-pixel.

A substrate SUB, a pixel circuit layer PCL, and a display element layer DPL may be provided in the pixel area of each of the first to third sub-pixels SP1 to SP3.

The pixel circuit layer PCL of each of the first to third sub-pixels SP1 to SP3 may include a buffer layer BFL disposed on the substrate SUB, first and second transistors T1 and T2 disposed on the buffer layer BFL, and a driving voltage line DVL. Furthermore, the pixel circuit layer PCL of each of the first to third sub-pixels SP1 to SP3 may further include a passivation layer PSV which is provided on the first and second transistors T1 and T2 and the driving voltage line DVL.

The substrate SUB may include transparent insulating material to allow light transmission.

The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be either a film substrate or a plastic substrate which includes polymer organic material. For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, materials constituting the substrate SUB may be changed, and include, for example, fiber reinforced plastic (FRP).

The buffer layer BFL may be provided on the substrate SUB and prevent impurities from diffusing into the first and second transistors T1 and T2. The buffer layer BFL may be omitted depending on the material of the substrate SUB or processing conditions.

The first transistor T1 may be a driving transistor which is electrically connected to some of the light emitting elements LD provided in the display element layer DPL of a corresponding sub-pixel to drive the light emitting elements LD. The second transistor T2 may be a switching transistor configured to switch the first transistor T1.

Each of the first and second transistors T1 and T2 may include a semiconductor layer SCL, a gate electrode GE, and source and drain electrodes SE and DE.

The semiconductor layer SCL may be disposed on the buffer layer BFL. The semiconductor layer SCL may include a source area which comes into contact with the source electrode SE, and a drain area which comes into contact with the drain electrode DE. An area between the source area and the drain area may be a channel area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the source area and the drain area may be a semiconductor pattern doped with an impurity.

The gate electrode GE may be provided on the semiconductor layer SCL with a gate insulating layer GI interposed therebetween.

The source electrode SE and the drain electrode DE may respectively come into contact with the source area and the drain area of the semiconductor layer SCL through corresponding contact holes which pass through an interlayer insulating layer ILD and the gate insulating layer GI.

In an embodiment of the present disclosure, each of the first and second transistors T1 and T2 included in the pixel circuit layer PCL provided in each sub-pixel may be formed of a low-temperature polycrystalline silicon (LTPS) thin-film transistor, but the present disclosure is not limited thereto. In some embodiments, each of the first and second transistors T1 and T2 may be formed of an oxide semiconductor thin-film transistor. Although in an embodiment of the present disclosure there has been described an example in which each of the first and second transistors T1 and T2 is a thin-film transistor having a top gate structure, the present disclosure is not limited thereto. In an embodiment, the first and second transistors T1 and T2 each may be a thin-film transistor having a bottom gate structure.

The driving voltage line DVL may be provided on the interlayer insulating layer ILD, but the present disclosure is not limited thereto. In some embodiments, the driving voltage line DVL may be provided on any one of insulating layers included in the pixel circuit layer PCL. The second driving power supply (VSS of FIG. 3A) may be applied to the driving voltage line DVL.

The passivation layer PSV may include a first contact hole CH1 which exposes a portion of the drain electrode DE of the first transistor T1, and a second contact hole CH2 which exposes a portion of the driving voltage line DVL.

The display element layer DPL of each of the first to third sub-pixels SP1, SP2, and SP3 may include a partition wall PW (or a bank), first and second electrodes REL1 and REL2, first and second connection lines CNL1 and CNL2, a plurality of light emitting elements LD, and a planarization layer PLL which are provided on the passivation layer PSV. In addition, the display element layer DPL of each of the first to third sub-pixels SP1, SP2, and SP3 may selectively further include at least one first contact electrode CNE1 which overlaps with the first electrode REL1, and/or at least one second contact electrode CNE2 which overlaps with the second electrode REL2. For example, the display element layer DPL of each of the first to third sub-pixels SP1, SP2, and SP3 may not include the first contact electrode CNE1 and the second contact electrode CNE2, as illustrated in FIG. 4A. In this case, the light emitting elements LD may be directly connected to the first electrode REL1 and the second electrode REL2. In an embodiment, the display element layer DPL of each of the first to third sub-pixels SP1, SP2, and SP3 may include the first contact electrode CNE1 and the second contact electrode CNE2, as illustrated in FIG. 4B. In this case, the light emitting elements LD may be electrically connected to the first and second electrodes REL1 and REL2 through the first and second contact electrodes CNE1 and CNE2, or electrically and/or physically connected both to the first and second contact electrodes CNE1 and CNE2 and to the first and second electrodes REL1 and REL2.

The partition wall PW may be provided on the passivation layer PSV in the emission area EMA of each of the first to third sub-pixels SP1, SP2, and SP3. Although not illustrated, a pixel defining layer (or a dam layer) formed of the same material as that of the partition wall PW may be formed and/or provided in the peripheral area PPA between adjacent sub-pixels to define the emission area EMA of each sub-pixel.

The partition wall PW may be spaced by a predetermined distance apart from a partition wall PW disposed adjacent thereto on the passivation layer PSV. Two adjacent partition walls PW may be disposed on the passivation layer PSV and spaced apart from each other by a length L of one light emitting element LD or more. As illustrated in FIG. 5, the partition wall PW may include a curved surface having a cross-sectional shape such as a semicircle, or a semiellipse which is reduced in width from one surface of the passivation layer PSV toward an upper end of the partition wall PW, but the present disclosure is not limited thereto.

In an embodiment, the partition wall PW may have a trapezoidal cross-section which is reduced in width upward from one surface of the passivation layer PSV, as illustrated in FIG. 6. In a sectional view, the shape of each partition wall PW is not limited to the foregoing examples, and may be changed in various ways within a range in which the efficiency of light emitted from each of the light emitting elements LD can be enhanced. The two adjacent partition walls PW may be disposed on the same plane on the passivation layer PSV and have the same height.

The first connection line CNL1 may extend from each of the first to third sub-pixels SP1, SP2, and SP3 in a first direction DR1 (e.g., 'horizontal direction'). The first connection line CNL1 may be provided in only one corresponding sub-pixel so as to independently drive each of the first to third sub-pixels SP1, SP2, and SP3.

The second connection line CNL2 may extend in a direction parallel to a direction in which the first connection line CNL1 extends. The second connection line CNL2 may be provided in common to the first to third sub-pixels SP1, SP2, and SP3. Therefore, the first to third sub-pixels SP1, SP2, and SP3 may be connected in common to the second connection line CNL2.

Each of the first and second electrodes REL1 and REL2 may be provided in the emission area EMA of each of the first to third sub-pixels SP1, SP2, and SP3 and extend in a second direction DR2 (e.g., 'vertical direction') intersecting with the first direction DR1. The first and second electrodes REL1 and REL2 may be provided on the same plane and spaced apart from each other by a predetermined distance.

The first electrode REL1 may be connected to the first connection line CNL1. In detail, the first electrode REL1 may be integrally connected to the first connection line CNL1. In an embodiment of the present disclosure, the first electrode REL1 may include a 1-1th electrode REL1_1 and a 1-2th electrode REL1_2 which diverge in the second direction DR2 from the first connection line CNL1 extending in the first direction DR1. The 1-1th electrode REL1_1, the 1-2th electrode REL1_2, and the first connection line CNL1 may be integrally provided and electrically and/or physically connected to each other. In the case where the first electrode REL1 and the first connection line CNL1 are formed and/or provided integrally with each other, the first connection line CNL1 may be regarded as one area of the first electrode REL1. However, the present disclosure is not limited thereto. For example, in some embodiments, the first electrode REL1 and the first connection line CNL1 may be individually formed and electrically connected to each other through a contact hole, via hole, or the like, which is not illustrated.

The second electrode REL2 may extend in the second direction DR2 and be electrically connected with the second connection line CNL2. In an embodiment of the present disclosure, the second electrode REL2 may diverge from the second connection line CNL2 in the second direction DR2. Hence, the second electrode REL2 and the second connection line CNL2 may be integrally provided and electrically and/or physically connected to each other. In the case where the second electrode REL2 and the second connection line CNL2 are formed and/or provided integrally with each other, the second connection line CNL2 may be regarded as one area of the second electrode REL2. However, the present disclosure is not limited thereto. For example, in some embodiments, the second electrode REL2 and the second connection line CNL2 may be individually formed and electrically connected to each other through a contact hole, via hole, or the like, which is not illustrated.

As illustrated in FIG. 4A, the first electrode REL1 may overlap with one end of the opposite ends EP1 and EP2 of each of the light emitting elements LD and come into direct contact with the one end so that the first electrode REL1 can be electrically and/or physically connected to each of the light emitting elements LD. However, the present disclosure is not limited thereto. For example, as illustrated in FIG. 4B, the first electrode REL1 may be electrically and/or physically connected to any one end of the opposite ends EP1 and EP2 of each of the light emitting elements LD through the first contact electrode CNE1.

Furthermore, as illustrated in FIG. 4A, the second electrode REL2 may overlap with a remaining end of the opposite ends EP1 and EP2 of each of the light emitting elements LD and come into direct contact with the remaining end so that the second electrode REL2 can be electrically and/or physically connected to each of the light emitting elements LD. However, the present disclosure is not limited thereto. For example, as illustrated in FIG. 4B, the second electrode REL2 may be electrically and/or physically connected to the remaining end of the opposite ends EP1 and EP2 of each of the light emitting elements LD through the second contact electrode CNE2.

Each of the first electrode REL1 and the second electrode REL2 may function as alignment electrodes for aligning the light emitting elements LD in the emission area EMA of each of the first to third sub-pixels SP1, SP2, and SP3.

Before the light emitting elements LD are aligned in the emission area EMA of each of the first to third sub-pixels SP1, SP2, and SP3, a first alignment voltage may be applied to the first electrode REL1 through the first connection line CNL1, and a second alignment voltage may be applied to the second electrode REL2 through the second connection line CNL2. The first alignment voltage and the second alignment voltage may have different voltage levels. As predetermined alignment voltages having different voltage levels are respectively applied to the first electrode REL1 and the second electrode REL2, an electric field may be formed between the first electrode REL1 and the second electrode REL2. Hence, the light emitting elements LD may be aligned between the first electrode REL1 and the second electrode REL2.

In a plan view, the second electrode REL2 may be provided between the 1-1th electrode REL1_1 and the 1-2th electrode REL1_2 and may be spaced apart from each of the 1-1th and 1-2th electrodes REL1_1 and REL1_2 by a predetermined distance. The 1-1th electrode REL1_1, the second electrode REL2, and the 1-2th electrode REL1_2 may be alternately disposed on the passivation layer PSV.

After the light emitting elements LD are aligned in the emission area EMA of each of the first to third sub-pixels SP1, SP2, and SP3, each of the first electrode REL1 and the second electrode REL2 may function as a driving electrode for driving the light emitting elements LD.

The first electrode REL1 and the second electrode REL2 may be made of material having a predetermined reflectivity to allow light emitted from the opposite ends EP1 and EP2 of each of the light emitting elements LD to travel in a direction (e.g., in a frontal direction) in which an image of the display device is displayed. In an embodiment of the present disclosure, the first electrode REL1, the second electrode REL2, the first connection line CNL1, and the second connection line CNL2 may be provided on the same layer and formed of the same material.

The first electrode REL1, the second electrode REL2, the first connection line CNL1, and the second connection line CNL2 may be formed of conductive material having a predetermined reflectivity. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT. The material of each of the first electrode REL1, the second electrode REL2, the first connection line CNL1, and the second connection line CNL2 is not limited to the foregoing materials.

Furthermore, although each of the first electrode REL1, the second electrode REL2, the first connection line CNL1, and the second connection line CNL2 is formed of a single layer, the present disclosure is not limited thereto. In an embodiment, each of the first electrode REL1, the second electrode REL2, the first connection line CNL1, and the second connection line CNL2 may have a multi-layer structure formed by stacking two or more kinds of material among metals, alloys, conductive oxides, and conductive polymers. Each of the first electrode REL1, the second electrode REL2, the first connection line CNL1, and the second connection line CNL2 may have a multi-layer structure having at least two or more layers to minimize a voltage drop due to a signal delay when signals are transmitted to the opposite ends EP1 and EP2 of each of the light emitting elements LD.

In an embodiment of the present disclosure, since the first electrode REL1 and the second electrode REL2 each have a shape corresponding to the shape of the partition wall PW, light emitted from the opposite ends EP1 and EP2 of each of the light emitting elements LD may be reflected by the first electrode REL1 and the second electrode REL2 and more effectively travel in the frontal direction of the display device. Consequently, the efficiency of light emitted from the light emitting elements LD may be enhanced.

In an embodiment of the present disclosure, the partition wall PW, the first electrode REL1, and the second electrode REL2 may function as reflective components enabling light emitted from each of the light emitting elements LD to travel in the frontal direction of the display device, thus enhancing the light output efficiency of the light emitting elements LD.

Any one electrode of the first electrode REL1 and the second electrode REL2 may be an anode electrode, and the other electrode may be a cathode electrode. In an embodiment of the present disclosure, the first electrode REL1 may be an anode electrode, and the second electrode REL2 may be a cathode electrode.

Each of the light emitting elements LD may be formed of a light emitting diode which is made of material having an inorganic crystal structure and has a subminiature size, e.g., corresponding to the nanometer scale or the micrometer scale. The light emitting elements LD may be aligned between the first electrode REL1 and the second electrode REL2 in each of the first to third sub-pixels SP1, SP2, and SP3.

Although at least two or tens of light emitting elements LD are provided in the emission area EMA of each of the first to third sub-pixels SP1, SP2, and SP3, the present disclosure is not limited thereto. In an embodiment, the number of light emitting elements LD provided in each sub-pixel may be changed in various ways.

Each of the light emitting elements LD may include an emission stack (or a stacked pattern) formed by successively stacking a first conductive semiconductor layer 11, an active layer 12, a second conductive semiconductor layer 13, and an electrode layer 15 in the longitudinal direction (L) of each light emitting element LD. Furthermore, each of the light emitting elements LD may further include an insulating film 14 which encloses an outer circumferential surface of the emission stack (or the stacked pattern).

In an embodiment of the present disclosure, each of the light emitting elements LD may have a cylindrical shape. In this case, each light emitting element LD may have a first end EP1 corresponding to any one of a lower portion of the cylinder and an upper portion of the cylinder, and a second end EP2 corresponding to the other of the lower portion of the cylinder and the upper portion of the cylinder. Any one of the first conductive semiconductor layer 11 and the second conductive semiconductor layer 13 may be disposed on the first end EP1 of each light emitting element LD, and the other of the first conductive semiconductor layer 11 and the second conductive semiconductor layer 13 may be disposed on the second end EP2 thereof.

In an embodiment of the present disclosure, each of the light emitting elements LD may emit any one light of color light and/or white light. Each of the light emitting elements LD may be aligned between the first electrode REL1 and the second electrode REL2 such that the longitudinal direction (L) is parallel to the first direction DR1. The light emitting elements LD may be divided into a plurality of first light emitting elements LD1 aligned between the 1-1th electrode REL1_1 and the second electrode REL2, and a plurality of second light emitting elements LD2 aligned between the second electrode REL2 and the 1-2th electrode REL1_2.

A second insulating layer INS2 for covering a portion of an upper surface of each of the light emitting elements LD may be provided on the light emitting elements LD. Hence, the opposite ends EP1 and EP2 of each of the light emitting elements LD may be exposed to the outside. Particularly, as illustrated in FIG. 7, the second insulating layer INS2 may cover a portion of an upper surface LD1_a of the first light emitting element LD1, in detail, the active layer 12 of the first light emitting element LD1, and allow the opposite ends EP1 and EP2 of the first light emitting element LD1 to be exposed to the outside.

The second insulating layer INS2 may include an inorganic insulating layer formed of inorganic material, and may fix in place each of the light emitting elements LD aligned in the emission area EMA of each of the first to third sub-pixels SP1, SP2, and SP3.

A first insulating layer INS1 may be provided between the passivation layer PSV and each of the light emitting elements LD.

The first insulating layer INS1 may be formed and/or provided under each of the light emitting elements LD between the first electrode REL1 and the second electrode REL2 in the emission area EMA of each sub-pixel. In the emission area EMA of each sub-pixel, the first insulating layer INS1 may be charged into space between the passivation layer PSV and each of the light emitting elements LD to stably support the light emitting elements LD and prevent the light emitting elements LD from being removed from the passivation layer PSV.

Furthermore, in the emission area EMA of each sub-pixel, the first insulating layer INS1 may expose one area of the first electrode REL1, and cover a remaining area, other than the exposed area, to protect the remaining area of the first electrode REL1. Furthermore, the first insulating layer INS1 may expose one area of the second electrode REL2, and cover a remaining area other than the exposed area, to protect the remaining area of the second electrode REL2. Here, in the case where as illustrated in FIG. 4B the display element layer DPL of each sub-pixel includes the first and second contact electrodes CNE1 and CNE2, the one area of the first electrode REL1 may refer to an area which electrically and/or physically comes into contact with the first contact electrode CNE1, and the one area of the second electrode REL2 may refer to an area which electrically and/or physically comes into contact with the second contact electrode CNE2.

In addition, the first insulating layer INS1 may be formed and/or provided on each of the first connection line CNL1 and the second connection line CNL2 in the peripheral area PPA of each sub-pixel so as to cover the first and second connection lines CNL1 and CNL2 and protect the first and second connection lines CNL1 and CNL2.

The first insulating layer INS1 may be formed of an inorganic insulating layer including inorganic material, or an organic insulating layer including organic material. Although in an embodiment of the present disclosure the first insulating layer INS1 may be formed of inorganic insulating layer having an advantage in protecting the light emitting elements LD from the pixel circuit layer PCL, the present disclosure is not limited thereto. In an embodiment, the first insulating layer INS1 may be formed of an organic insulating layer that has an advantage in planarization of support surfaces of the light emitting elements LD.

The planarization layer PLL may be disposed between the first electrode REL1 and the second electrode REL2 in the emission area EMA of each sub-pixel and partially overlap with each of the first and second electrodes REL1 and REL2. The planarization layer PLL may have a bar shape extending in the second direction DR2 and correspond to each of the light emitting elements LD.

The planarization layer PLL may be divided into one area A (hereinafter, referred to as 'first area') which overlaps with each of the light emitting elements LD, and a remaining area B (hereinafter, referred to as 'second area') other than the first area A. The second area B may refer to an area which does not overlap with each of the light emitting elements LD and, in other words, on which the light emitting elements LD are not formed and/or provided.

For the sake of explanation, the first area A will be first described, and then the second area B will be described.

In the first area A, the planarization layer PLL may be formed and/or provided on the first insulating layer INS1 between the first end EP1 of the first light emitting element LD1 and the 1-1th electrode REL1_1 and between the second end EP2 of the first light emitting element LD1 and the second electrode REL2.

In the following embodiments, for the sake of explanation, the planarization layer PLL provided between the first end EP1 of the first light emitting element LD1 and the 1-1th electrode REL1_1 will be referred to as a first planarization layer PLL, and the planarization layer PLL provided between the second end EP2 of the first light emitting element LD1 and the second electrode REL2 will be referred to as a second planarization layer PLL.

The first planarization layer PLL and the second planarization layer PLL may be integrally provided and simultaneously formed. In the case where the first planarization layer PLL and the second planarization layer PLL are integrally provided, any one planarization layer PLL of the first planarization layer PLL and the second planarization layer PLL may be regarded as one area of the other planarization layer PLL.

The first planarization layer PLL may be provided on the first insulating layer INS1 between the 1-1th electrode REL1_1 and the first end EP1 of the first light emitting element LD1, and come into contact with at least a portion of a first sidewall 11a of the first light emitting element LD1. Here, the first sidewall 11a of the first light emitting element LD1 may refer to a lower surface of the first conductive semiconductor layer 11 provided on the first end EP1 of the first light emitting element LD1, and be a surface successive to a lower surface LD1_b of the first light emitting element LD1.

In an embodiment of the present disclosure, the first planarization layer PLL may overlap with each of the 1-1th electrode REL1_1 and the 1-1th contact electrode CNE1_1, and be disposed between the 1-1th electrode REL1_1 and the 1-1th contact electrode CNE1_1. In detail, as illustrated in FIG. 7, the first planarization layer PLL may be provided on the first insulating layer INS1 on the 1-1th electrode REL1_1, and the 1-1th contact electrode CNE1_1 may be directly formed and/or provided on the first planarization layer PLL.

The second planarization layer PLL may be provided on the first insulating layer INS1 between the second end EP2 of the first light emitting element LD1 and the second electrode REL2, and come into contact with at least a portion of a second sidewall 15a of the first light emitting element LD1. Here, the second sidewall 15a of the first light emitting element LD1 may refer to an upper surface of the electrode layer 15, or an upper surface of the second conductive semiconductor layer 13, that is provided on the second end EP2 of the first light emitting element LD1, and be a surface successive to the lower surface LD1_b of the first light emitting element LD1.

In an embodiment of the present disclosure, the second planarization layer PLL may overlap with each of the second electrode REL2 and the second contact electrode CNE2, and be disposed between the second electrode REL2 and the second contact electrode CNE2. In detail, as illustrated in FIG. 7, the second planarization layer PLL may be provided on the first insulating layer INS1 on the second electrode REL2, and the second contact electrode CNE2 may be directly formed and/or provided on the second planarization layer PLL.

In an embodiment of the present disclosure, a height h (a thickness) of each of the first planarization layer PLL and the second planarization layer PLL may be less than a diameter D of the first light emitting element LD1. In detail, the height h (the thickness) of each of the first planarization layer PLL and the second planarization layer PLL may correspond to (be equal to) a half of the diameter D of the first light emitting element LD1 or be less than the half of the diameter D. For example, in the case where the diameter D of the first light emitting element LD1 ranges from 0.5 µm to 500 µm, the height h (the thickness) of each of the first planarization layer PLL and the second planarization layer PLL may range from 0.25 µm to 250 µm. However, the height h (the thickness) of each of the first planarization layer PLL and the second planarization layer PLL is not limited thereto, and the height h (the thickness) may be changed in various ways depending on design conditions, etc. of the display device using the first light emitting element LD1.

In an embodiment of the present disclosure, the planarization layer PLL may be formed of an organic insulating layer including organic material so that the first light emitting element LD1 can be stably supported on the first insulating layer INS1. The organic insulating layer may include, for example, at least one of polyacrylates resin, epoxy resin, phenolic resin, polyamides resin, polyimides rein, unsaturated polyesters resin, poly-phenylene ethers resin, poly-phenylene sulfides resin, and benzocyclobutene resin. However, the material of the planarization layer PLL is not limited to the above-mentioned materials.

The planarization layer PLL may stably support the lower surface LD1_b of the first light emitting element LD1, and planarize a support surface for the first light emitting element LD1 that is positioned on the first insulating layer INS1.

In the case where the first light emitting element LD1 has a cylindrical shape, the outer surface thereof may be curved (e.g., circular). In this case, due to the shape of the first light emitting element LD1, the thickness of an electrode formed and/or provided on the first light emitting element LD1 may be reduced on the lower surface LD1_b that is a portion on which the first light emitting element LD1 comes into contact with the first insulating layer INS1. Particularly, the thickness of the 1-1th contact electrode CNE1_1 formed on the first end EP1 of the first light emitting element LD1 may be reduced on the first sidewall 11a successive to the lower surface LD1_b of the first light emitting element LD1. Likewise, the thickness of the second contact electrode CNE2 formed on the second end EP2 of the first light emitting element LD1 may be reduced on the second sidewall 15a successive to the lower surface LD1_b of the first light emitting element LD1.

In the case where the thickness of each of the 1-1th contact electrode CNE1_1 and the second contact electrode CNE2 is reduced in a specific area rather than being uniform, the contact resistance of each of the 1-1th and second contact electrodes CNE1_1 and CNE2 may be increased. Due to an increase in the contact resistance, contact failure may occur between the first light emitting element LD1 and each of the 1-1th and second contact electrodes CNE1_1 and CNE2.

To avoid the foregoing problem, in an embodiment of the present disclosure, the planarization layer PLL is provided in the form of being charged into the lower surface LD1_b of the first light emitting element LD1 that comes into direct contact with the first insulating layer INS1 so that the planarization layer PLL comes into contact with at least a portion of each of the first and second sidewalls 11a and 15a of the first light emitting element LD1. Hence, a step difference of the lower surface LD1_b due to the shape of the first light emitting element LD1 may be mitigated, so that the lower surface LD1_b may be planarized.

In this case, the thickness of each of the 1-1th and second contact electrodes CNE1_1 and CNE2 formed and/or provided over each of the first and second ends EP1 and EP2 of the first light emitting element LD1 may be uniform without reducing in the specific area, so that step coverage of the 1-1th and second contact electrodes CNE1_1 and CNE2 can be enhanced.

Hence, the contact resistance of each of the 1-1th contact electrode CNE1_1 and the second contact electrode CNE2 may be reduced, and the contact failure of the first light emitting element LD1 resulting from an increase in the contact resistance may be minimized. In the case where the contact resistance of each of the 1-1th contact electrode CNE1_1 and the second contact electrode CNE2 is reduced, the efficiency of light eventually emitted from the first light emitting element LD1 can be enhanced.

Furthermore, since the planarization layer PLL is provided between the first insulating layer INS1 and each of the first and second sidewalls 11a and 15a that are successive to the lower surface LD1_b of the first light emitting element LD1, a support surface area of the first light emitting element LD1 can be increased, so that the first light emitting element LD1 may be more stably fixed.

In the foregoing embodiments, there has been described only the case where the first light emitting element LD1 has a cylindrical shape, but the present disclosure is not limited thereto. In an embodiment, even when the first light emitting element LD1 has a triangular shape, a rectangular shape, a polygonal shape, an elliptical shape, a semi-elliptical shape, or a conical shape, the planarization layer PLL may be disposed so that the support surface of the first light emitting element LD1 can be planarized.

In an embodiment of the present disclosure, a support layer STL may be further disposed in the emission area EMA of each sub-pixel.

The support layer STL may be disposed between the first insulating layer INS1 on the passivation layer PSV and the lower surface LD1_b of the first light emitting element LD1 and may not overlap with the first electrode REL1 and the second electrode REL2. Particularly, the support layer STL may be provided between the lower surface LD1_b of the first light emitting element LD1 and the first insulating layer INS1 that is provided on the passivation layer PSV and faces the lower surface LD1_b.

In an embodiment of the present disclosure, the support layer STL may be provided in the form of being charged into space between the first insulating layer INS1 on the passivation layer PSV and the lower surface LD1_b of the first light emitting element LD1. In other words, the support layer STL may be charged into the space between the lower surface LD1_b of the first light emitting element LD1 and the first insulating layer INS1 provided on the passivation layer PSV, thus stably supporting the lower surface LD1_b of the first light emitting element LD1.

The support layer STL may include the same material as that of the planarization layer PLL. For example, the support layer STL may be formed of organic insulating material including organic material. The support layer STL may be provided integrally with the planarization layer PLL. In this case, the support layer STL may be regarded as one area of the planarization layer PLL.

A width W (hereinafter, referred to as 'horizontal width') of the planarization layer PLL including the support layer STL with respect to the first direction DR1 may be equal to or greater than the length L of the first light emitting element LD1. For example, when the length L of the first light emitting element LD1 ranges from 1 μm to 10 μm, the horizontal width W of the planarization layer PLL may be equal to or greater than the length of the first light emitting element LD1. In the first area A, the horizontal width W of the planarization layer PLL may refer to the sum of all of a horizontal width of the first planarization layer PLL, a horizontal width of the second planarization layer PLL, and a horizontal width of the support layer STL, in a sectional view.

Next, in the second area B, as illustrated in FIG. 9, the planarization layer PLL may mitigate a step difference caused by the partition wall PW and planarize support surfaces (or outer surfaces) of some components formed and/or provided on the planarization layer PLL. The some components may include, for example, the 1-1th contact electrode CNE1_1, the third insulating layer INS3, the second contact electrode CNE2, etc. In the second area B, the width W of the planarization layer PLL is the same as the width W of the planarization layer PLL in the first area A including the support layer STL.

In an embodiment of the present disclosure, the first connection line CNL1 may be electrically connected to any one electrode of the drain electrode DE or the source electrode SE of the first transistor T1 through the first contact hole CH1 of the passivation layer PSV. In an embodiment of the present disclosure, for the sake of explanation, there has been illustrated the case where the first connection line CNL1 is connected to the drain electrode DE of the first transistor T1 through the first contact hole CH1. As described above, since the first connection line CNL1 is integrally provided with the first electrode REL1, a signal of the first transistor T1 applied to the first connection line CNL1 may be transmitted to the first electrode REL1.

In an embodiment of the present disclosure, the second connection line CNL2 may be electrically connected to the driving voltage line DVL through the second contact hole CH2 of the passivation layer PSV. As described above, since the second connection line CNL2 is integrally provided with the second electrode REL2, the voltage of the second driving power supply VSS of the driving voltage line DVL applied to the second connection line CNL2 may be transmitted to the second electrode REL2.

The first electrode REL1 may be disposed adjacent to one end of the opposite ends EP1 and EP2 of each of the light emitting elements LD, and may be electrically connected to each of the light emitting elements LD through the first contact electrode CNE1. Therefore, a signal of the first transistor T1 that is applied to the first electrode REL1 may be transmitted to each of the light emitting elements LD through the first contact electrode CNE1.

The second electrode REL2 may be disposed adjacent to the other end of the opposite ends EP1 and EP2 of each of the light emitting elements LD, and may be electrically connected to each of the light emitting elements LD through the second contact electrode CNE2. Hence, the voltage of the second driving power supply VSS applied to the second electrode REL2 may be transmitted to each of the light emitting elements LD.

As illustrated in FIG. 4B, the first contact electrode CNE1 may be provided on the first electrode REL1 to electrically and/or physically reliably connect the first electrode REL1 with one end of the opposite ends EP1 and EP2 of each of the light emitting elements LD. The first contact electrode CNE1 may be formed of transparent conductive material to allow light emitted from each of the light emitting elements LD and reflected by the first electrode REL1 in the frontal direction of the display device to travel in the frontal direction without loss.

In a plan view, the first contact electrode CNE1 may cover the first electrode REL1 and overlap with the first electrode REL1. Furthermore, the first contact electrode CNE1 may partially overlap with one of the opposite ends EP1 and EP2 of each of the light emitting elements LD. The first contact electrode CNE1 may include a 1-1th contact electrode CNE1_1 provided on the 1-1th electrode REL1_1, and a 1-2th contact electrode CNE1_2 provided on the 1-2th electrode REL1_2.

A third insulating layer INS3 for covering the first contact electrode CNE1 may be provided on the first contact electrode CNE1. The third insulating layer INS3 may prevent the first contact electrode CNE1 from being exposed to the outside, thus preventing the first contact electrode CNE1 from being corroded.

The third insulating layer INS3 may be formed of an inorganic insulating layer including inorganic material, or an organic insulating layer including organic material. Although the third insulating layer INS3 may have a single layer structure as shown in the drawing, the present disclosure is not limited thereto. In an embodiment, the third insulating layer INS3 may be formed of multiple layers. In the case where the third insulating layer INS3 has a multilayer structure, the third insulating layer INS3 may have a structure formed by alternately stacking a plurality of inorganic insulating layers and a plurality of organic insulating layers. For example, the third insulating layer INS3 may have a structure formed by sequentially stacking a first inorganic insulating layer, an organic insulating layer, and a second inorganic insulating layer.

As illustrated in FIG. 4B, the second contact electrode CNE2 may be provided on the second electrode REL2. In a plan view, the second contact electrode CNE2 may cover the second electrode REL2 and overlap with the second electrode REL2. Furthermore, the second contact electrode CNE2 may overlap with the second end EP2 of each of the first light emitting elements LD1 and the first end EP1 of each of the second light emitting elements LD2. The second contact electrode CNE2 may be made of the same material as that of the first contact electrode CNE1, but the present disclosure is not limited thereto.

A fourth insulating layer INS4 for covering the second contact electrode CNE2 may be provided on the second contact electrode CNE2. The fourth insulating layer INS4 may prevent the second contact electrode CNE2 from being exposed to the outside, thus preventing the second contact electrode CNE2 from being corroded. The fourth insulating layer INS4 may be formed of either an inorganic insulating layer or an organic insulating layer.

An overcoat layer OC may be provided on the fourth insulating layer INS4. The overcoat layer OC may be an encapsulation layer, configured to mitigate a step difference formed by the partition wall PW, the first and second electrodes REL1 and REL2, the first and second contact electrodes CNE1 and CNE2 that are disposed under the overcoat layer OC, and prevent oxygen or water from permeating the light emitting elements LD.

As described above, predetermined voltages may be applied through the first electrode REL1 and the second electrode REL2 to the opposite ends EP1 and EP2 of each of the light emitting elements LD aligned in the emission area EMA of each of the first to third sub-pixels SP1, SP2, and SP3. Hence, each of the light emitting elements LD may emit light by recombining of electron-hole pairs in the active layer 12 of each of the light emitting elements LD. Here, the active layer 12 may emit light having a wavelength range from 400 nm to 900 nm.

In an embodiment of the present disclosure, the first contact electrode CNE1 and the second contact electrode CNE2 may be formed and/or provided on different layers, but the present disclosure is not limited thereto. In some embodiments, the first contact electrode CNE1 and the second contact electrode CNE2 may be provided on the same layer on the same surface. Detailed description pertaining thereto will be made below with reference to FIGS. 11 and 12.

A capping layer CPL may be formed and/or provided in the emission area EMA of each sub-pixel.

The capping layer CPL may be respectively disposed between the first electrode REL1 and the first contact electrode CNE1 and between the second electrode REL2 and the second contact electrode CNE2. The capping layer CPL may prevent the corresponding electrode from being damaged due to failure caused during a process of fabricating the display device, and may reinforce adhesive force between the corresponding electrode and the passivation layer PSV. The capping layer CPL may be formed of transparent conductive material such as indium zinc oxide (IZO) to minimize loss of light emitted from each of the light emitting elements LD and reflected by the corresponding electrode in the frontal direction of the display device.

Figure 10A:
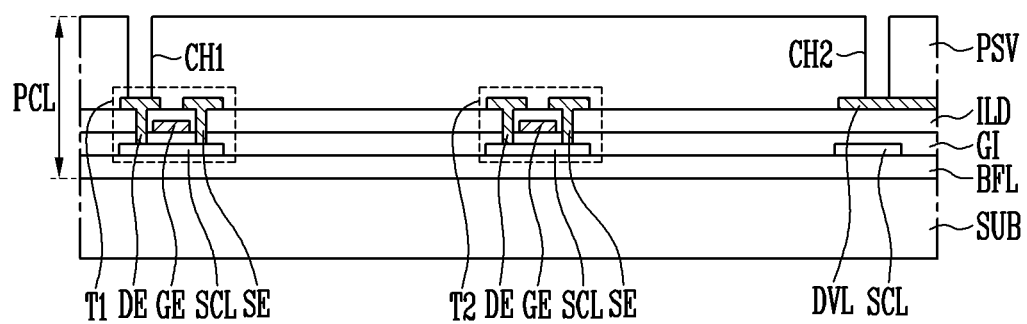
FIGS. 10A to 10O are sectional diagrams sequentially illustrating a method of fabricating the display device of FIG. 5.
Figure 10B:
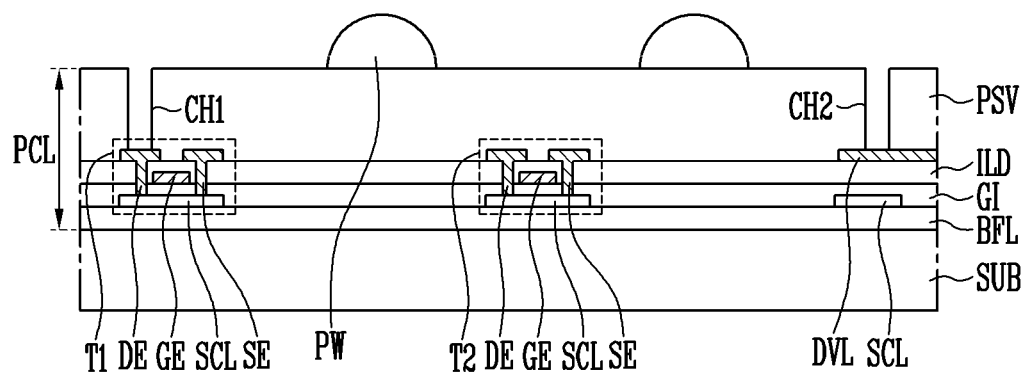
Figure 10C:
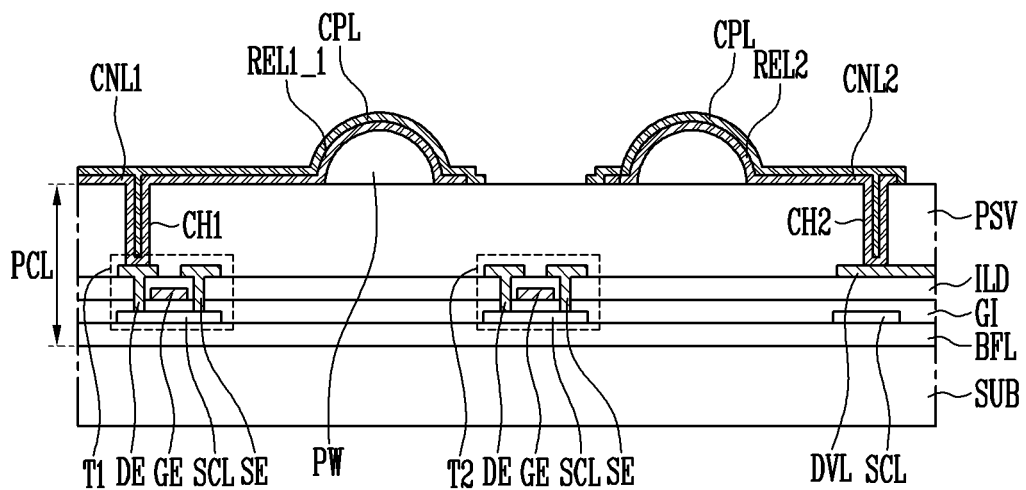
Figure 10D:
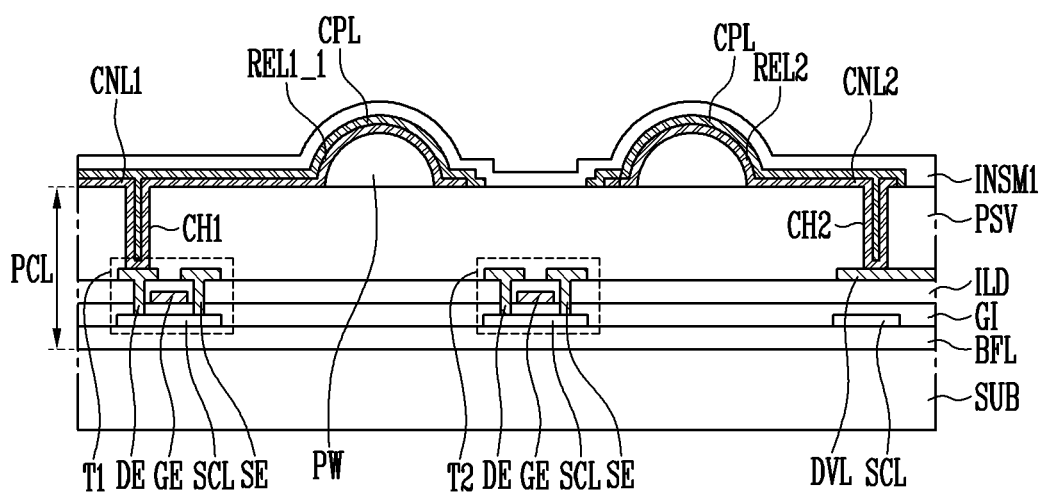
Figure 10E:
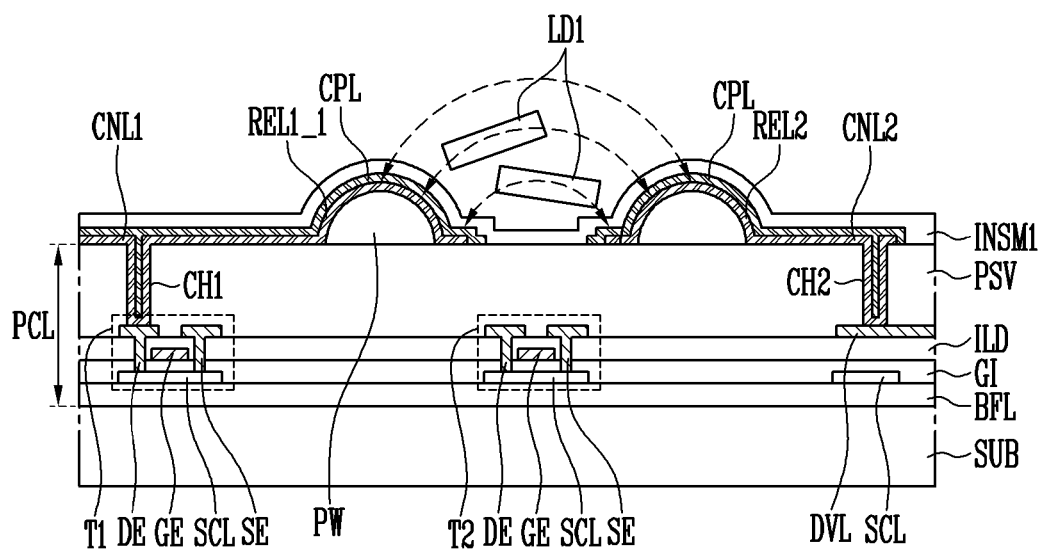
Figure 10F:
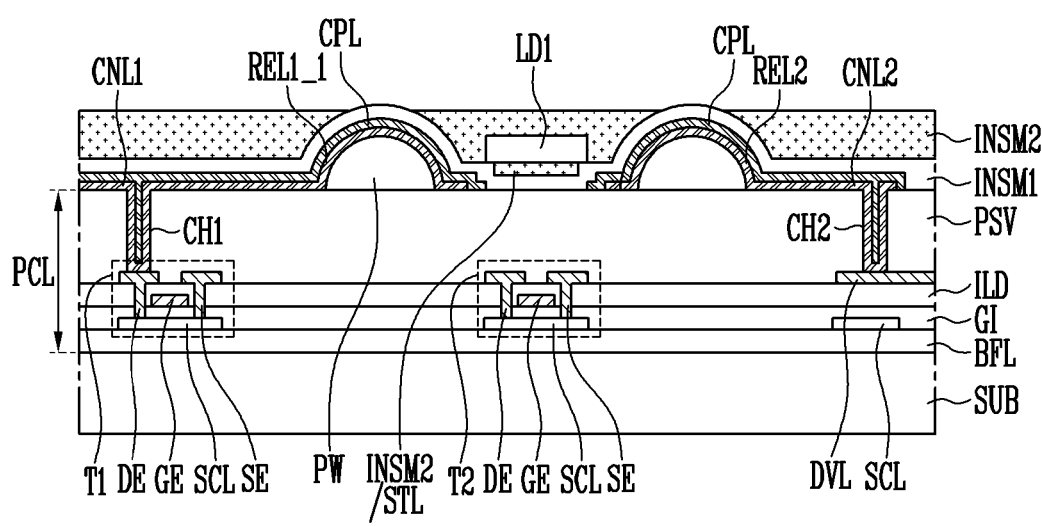
Figure 10G:
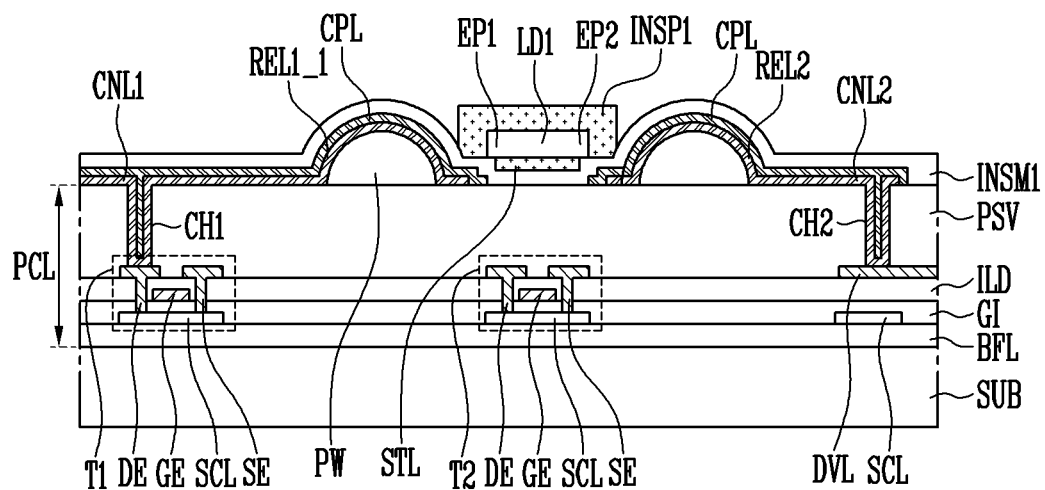
Figure 10H:
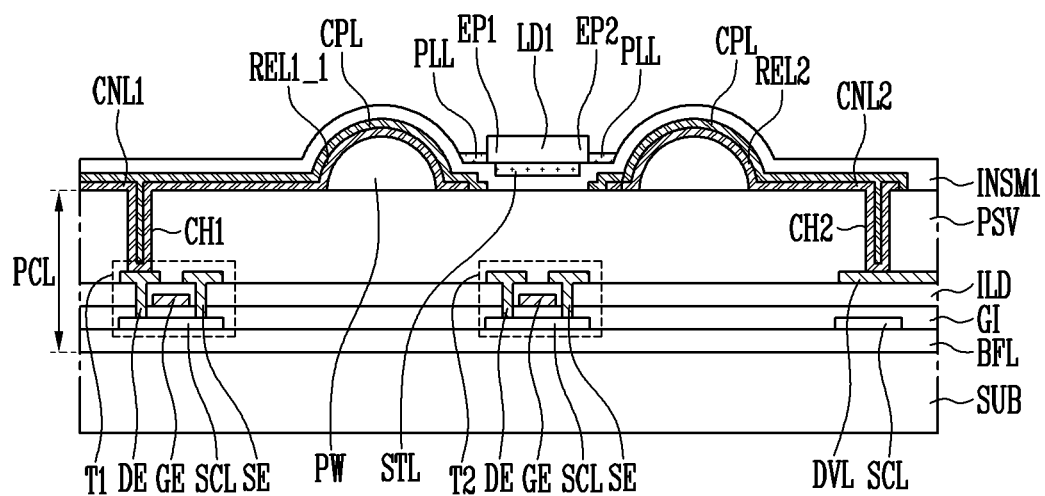
Figure 10I:
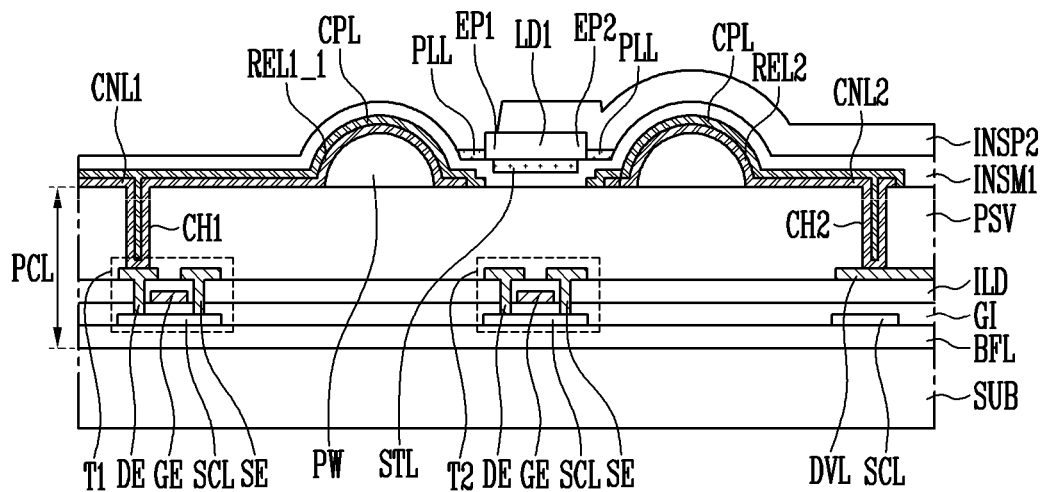
Figure 10J:
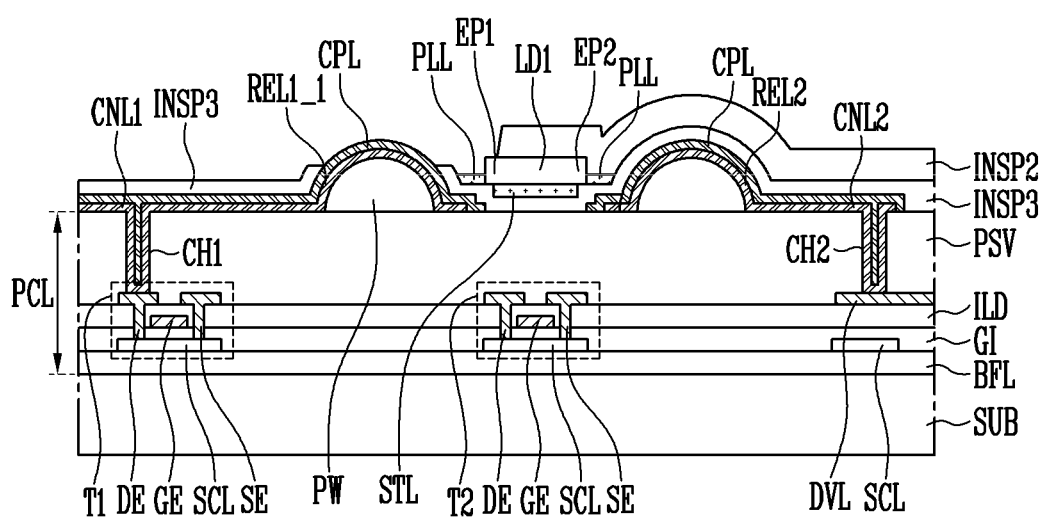
Figure 10K:
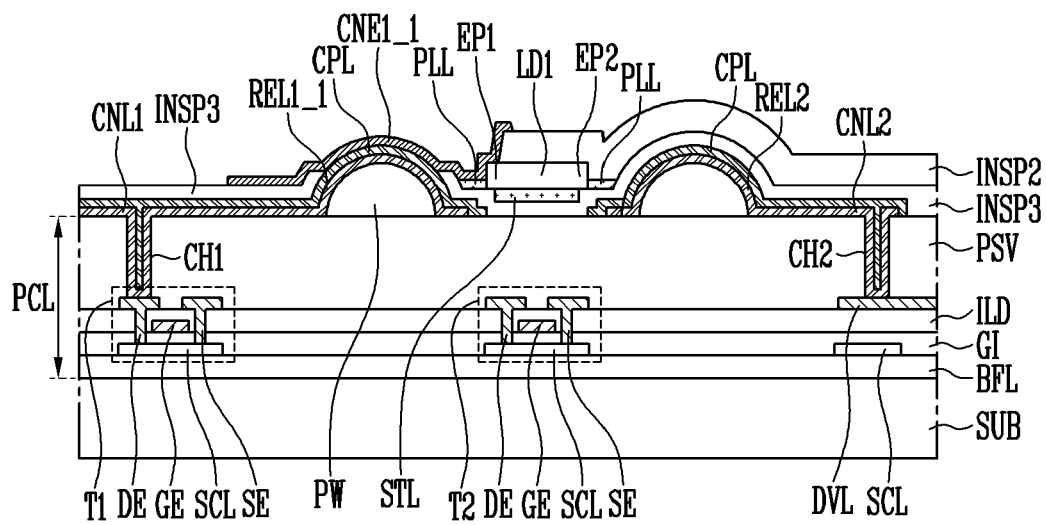
Figure 10L:
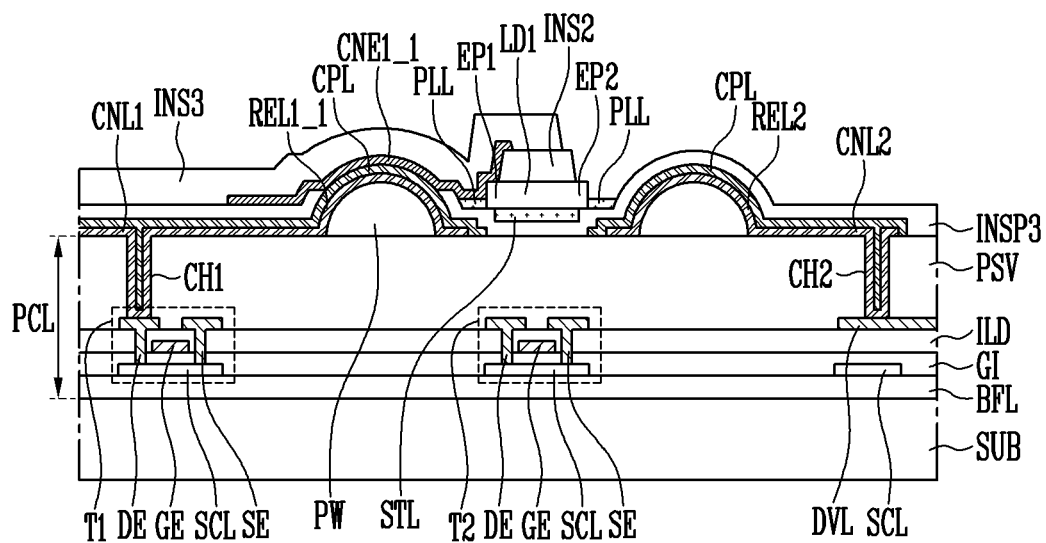
Figure 10M:
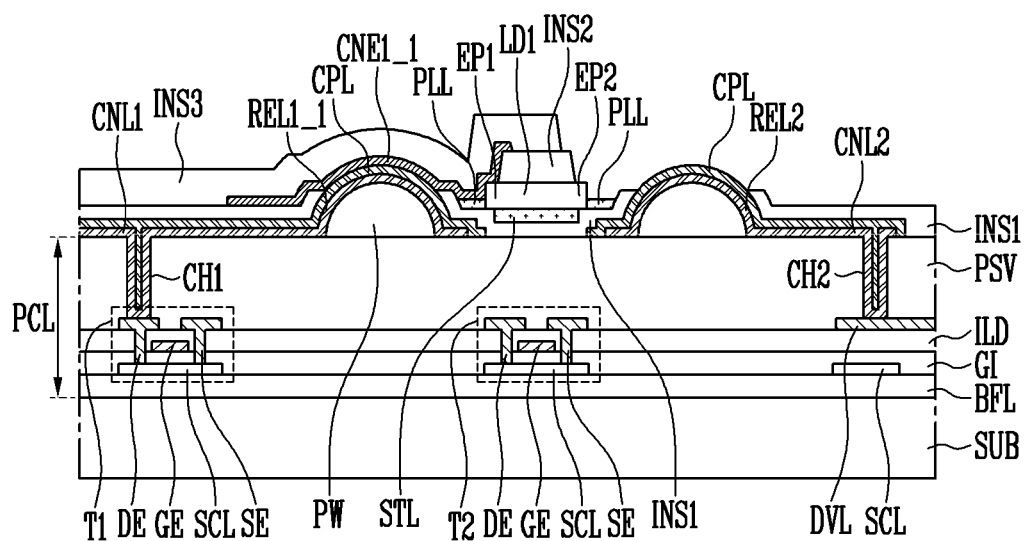
Figure 10N:
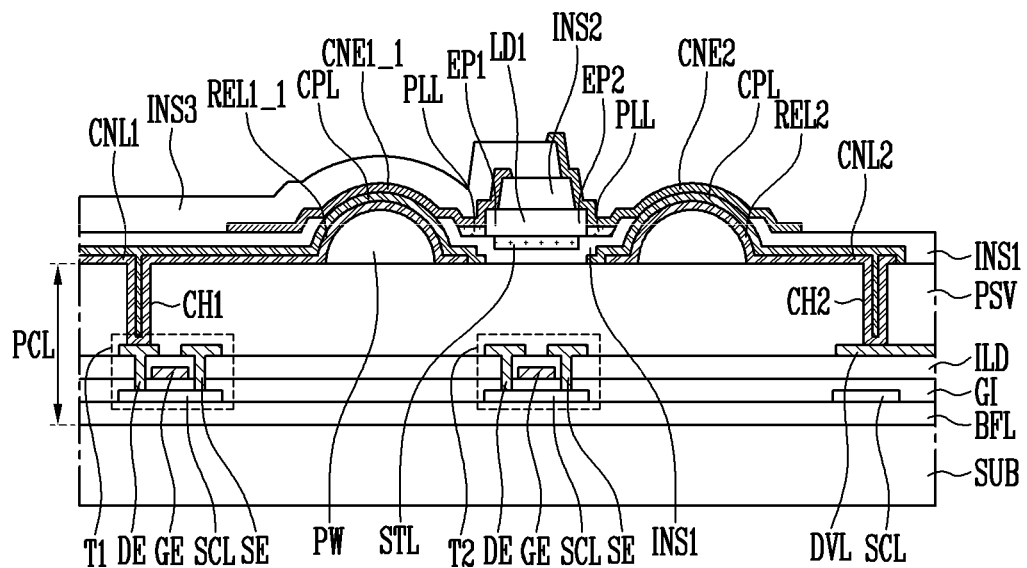
Figure 10O:
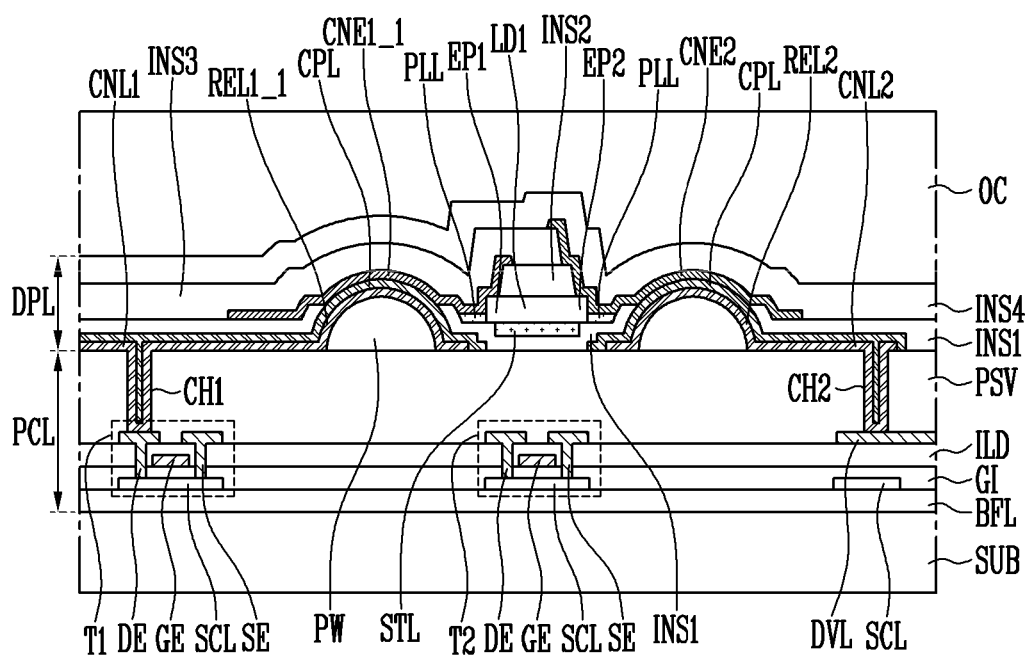

FIGS. 10A to 10O are sectional diagrams sequentially illustrating a method of fabricating the display device of FIG. 5.

For the sake of explanation, FIGS. 10E to 10O illustrate only one first light emitting element LD1 aligned between the 1-1th electrode REL1_1 and the second electrode REL2 among the light emitting elements LD, but the one first light emitting element LD1 may substitute for each of the plurality of light emitting elements illustrated in FIG. 5.

Referring to FIGS. 1A to 10A, the pixel circuit layer PCL of each of the first to third sub-pixels SP1, SP2, and SP3 is formed. The pixel circuit layer PCL may further include the first and second transistors T1 and T2, the driving voltage line DVL, and the passivation layer PSV. The passivation layer PSV may include the first contact hole CH1 which exposes the drain electrode DE of the first transistor T1, and the second contact hole CH2 which exposes the driving voltage line DVL.

Referring to FIGS. 1A to 10B, the partition wall PW is formed on the passivation layer PSV in the emission area EMA of each of the first to third sub-pixels SP1, SP2, and SP3.

The partition wall PW may be spaced by a predetermined distance apart from the partition wall PW disposed adjacent thereto on the passivation layer PSV. The partition wall PW may include an inorganic insulating layer formed of inorganic material or an organic insulating layer formed of organic material. In an embodiment, the partition wall PW may include a single organic insulating layer and/or a single inorganic insulating layer, but the present disclosure is not limited thereto. For example, the partition wall PW may have a multi-layer structure formed by stacking a plurality of organic insulating layers and a plurality of inorganic insulating layers.

Referring to FIGS. 1A to 10C, the first and second electrodes REL1 and REL2 and the first and second connection lines CNL1 and CNL2 that include conductive material having a high reflectivity are formed on the passivation layer PSV of each sub-pixel including the partition wall PW.

Each of the first electrode REL1 and the second electrode REL2 may be formed on the corresponding partition wall PW in the emission area EMA of each sub-pixel. Each of the first connection line CNL1 and the second connection line CNL2 may be provided in the peripheral area PPA of each sub-pixel.

The first electrode REL1 may be integrally provided with the first connection line CNL1, and electrically and/or physically connected with the first connection line CNL1. The first electrode REL1 may include a 1-1th electrode REL1_1 and a 1-2th electrode REL1_2 which diverge from the first connection line CNL1. The second electrode REL2 may be integrally provided with the second connection line CNL2, and electrically and/or physically connected with the second connection line CNL2.

Subsequently, the capping layer CPL is formed on each of the first and second electrodes REL1 and REL2.

Referring to FIGS. 1A to 10D, a first insulating material layer INSM1 is formed on the passivation layer PSV on which the capping layer CPL is formed. The first insulating material layer INSM1 may be formed of an inorganic insulating layer including inorganic material, or an organic insulating layer including organic material.

Referring to FIGS. 1A to 10E, an electric field is formed between the first electrode REL1 and the second electrode REL2 by respectively applying corresponding alignment voltages to the first and second electrodes REL1 and REL2 through the first connection line CNL1 and the second connection line CNL2.

In the case where direct current power or alternating current power having predetermined voltage and period is repeatedly applied several times to each of the first and second electrodes REL1 and REL2 through the first and second connection lines CNL1 and CNL2, an electric field may be formed between the first and second electrodes REL1 and REL2 by a difference in potential between the first and second electrodes REL1 and REL2.

After an electric field is formed between the first electrode REL1 and the second electrode REL2 that are formed in the emission area EMA of each sub-pixel, the light emitting elements LD including the first and second light emitting elements LD1 and LD2 are supplied in an inkjet printing scheme or the like. For example, the light emitting elements LD may be supplied to the emission area EMA of each sub-pixel by disposing a nozzle over the passivation layer PSV and dropping a solvent including the light emitting elements LD onto the passivation layer PSV through the nozzle. Here, the solvent may be any one of acetone, water, alcohol, and toluene, but the present disclosure is not limited thereto. For example, the solvent may include material which may be vaporized at the room temperature or by heat. Furthermore, the solvent may have the form of ink or paste. A method of supplying the light emitting elements LD is not limited to that of the foregoing embodiment. The method of supplying the light emitting elements LD may be changed in various ways.

After the light emitting elements LD have been supplied to the emission area EMA of each sub-pixel, the solvent may be removed.

If the light emitting elements LD are supplied to the emission area EMA of each sub-pixel, self-alignment of the light emitting elements LD may be induced by the electric field formed between the first electrode REL1 and the second electrode REL2. Hence, the light emitting elements LD may be aligned between the first electrode REL1 and the second electrode REL2. In other words, the light emitting elements LD may be intensively aligned in a target area, e.g., the emission area EMA of each sub-pixel. Particularly, each of the light emitting elements LD may be aligned on the first insulating material layer INSM1 in the emission area EMA of each sub-pixel.

Referring to FIGS. 1A to 10F, after the light emitting elements LD are aligned in the emission area EMA of each sub-pixel, a second insulating material layer INSM2 is formed on the first insulating material layer INSM1 and the light emitting elements LD. The second insulating material layer INSM2 may include an organic insulating layer formed of organic material.

The second insulating material layer INSM2 may cover the first insulating material layer INSM1 and the light emitting elements LD and be provided in the form of being charged between the lower surface (refer to LD1_b of FIG. 7) of each light emitting element LD and the first insulating material layer INSM1. In an embodiment of the present disclosure, the second insulating material layer INSM2 that is charged between the lower surface LD1_b of each light emitting element LD and the first insulating material layer INSM1 may eventually become a support layer STL. The support layer STL may stably support each light emitting element LD and planarize the support surface of the light emitting element LD.

Referring to FIGS. 1A to 10G, after a mask (not illustrated) is disposed over the second insulating material layer INSM2, the first insulating pattern INSP1 that covers each of the light emitting elements LD is formed by patterning the second insulating material layer INSM2 through a process using the mask.

The first insulating pattern INSP1 may be provided in the form of enclosing both the upper surface (refer to LD1_a of FIG. 7) and the first and second sidewalls (refer to 11a and 15a of FIG. 7) of each of the light emitting elements LD. The first insulating pattern INSP1 may include the same material as that of the support layer STL provided between the first insulating material layer INSM1 on the passivation layer PSV and the lower surface LD1_b of each of the light emitting elements LD.

Referring to FIGS. 1A to 10H, the first insulating pattern INSP1 is etched through an ashing process.

The planarization layer PLL which comes into contact with at least a portion of each of the opposite ends EP1 and EP2 of each light emitting element LD in a plan view may be formed by etching a portion of the first insulating pattern INSP1 through the ashing process. The planarization layer PLL may come into contact with at least a portion of each of the first and second sidewalls 11a and 15a of each light emitting element LD. The planarization layer PLL may include the same material as that of the support layer STL.

In an embodiment of the present disclosure, the planarization layer PLL may be provided in the form of being charged into the lower surface LD1_b of each light emitting element LD and be brought into contact with at least a portion of each of the first and second sidewalls 11a and 15a of the light emitting element LD. The lower surface LD1_b of the each light emitting element LD may refer to a surface of the light emitting element LD that is supported on the first insulating material layer INSM1.

Since the planarization layer PLL is provided in the form of being charged into the lower surface LD1_b of each light emitting element LD, a step difference of the lower surface LD1_b due to the shape of the light emitting element LD is mitigated so that the lower surface LD1_b can be mitigated. In this case, the first and second contact electrodes CNE1 and CNE2 to be formed through a subsequent process may be directly formed on the planarization layer PLL, so that the overall thicknesses of the first and second contact electrodes CNE1 and CNE2 may be uniform.

Referring to FIGS. 1A to 10I, after an insulating material layer (not illustrated) is formed on the planarization layer PLL, the second insulating pattern INSP2 is formed by patterning the insulating material layer.

The second insulating pattern INSP2 may cover the first insulating material layer INSM1 disposed on the second electrode REL2 and expose the first insulating material layer INSM1 disposed on the first electrode REL1. Furthermore, the second insulating pattern INSP2 may cover the second end EP2 of each light emitting element LD and the planarization layer PLL that comes into contact with at least a portion of the second end EP2, and expose the first end EP1 of the light emitting element LD and the planarization layer PLL that comes into contact with at least a portion of the first end EP1.

The second insulating pattern INSP2 may be formed of an inorganic insulating layer including inorganic material, or an organic insulating layer including organic material.

Referring to FIGS. 1A to 10J, after a mask (not illustrated) is disposed over the second insulating pattern INSP2, the third insulating pattern INSP3 is formed by patterning an exposed portion of the first insulating material layer INSM1 using the mask.

The third insulating pattern INSP3 may expose at least one area of the capping layer CPL disposed on the first electrode REL1 to the outside and cover a remaining area other than the one area. If the capping layer CPL is not disposed, at least one area of the first electrode REL1 may be exposed outside the third insulating pattern INSP3.

Referring to FIGS. 1A to 10K, the first contact electrode CNE1 is formed using a sputtering method or the like on the exposed capping layer CPL, the first end EP1 of each light emitting element LD, and the planarization layer PLL that comes into contact with at least the portion of the first end EP1.

The first contact electrode CNE1 may include a 1-1th contact electrode CNE1_1 formed on the capping layer CPL on the 1-1th electrode REL1_1, and a 1-2th contact electrode CNE1_2 formed on the capping layer CPL on the 1-2th electrode REL1_2. The first contact electrode CNE1 may be electrically and/or physically connected with the first electrode REL1 through the capping layer CPL.

The first contact electrode CNE1 may be directly formed on the planarization layer PLL and be electrically and/or physically connected to the first end EP1 of each light emitting element LD. In an embodiment of the present disclosure, since the first contact electrode CNE1 is formed on the first end EP1 successive to the lower surface LD1_b of each light emitting element LD that has a smooth step difference due to the planarization layer PLL, the first contact electrode CNE1 may have an overall uniform thickness. Hence, the step coverage of the first contact electrode CNE1 may be enhanced.

Referring to FIGS. 1A to 10L, after a mask (not illustrated) is disposed over the passivation layer PSV on which the first contact electrode CNE1, etc. are formed, the second insulating layer INS2 is formed by patterning the second insulating pattern INSP2 using the mask.

The second insulating layer INS2 may cover at least a portion of the upper surface (refer to LD1_a of FIG. 7) of each light emitting element LD and expose the second end EP2 of the light emitting element LD to the outside. The second insulating layer INS2 may be formed of an inorganic insulating layer including inorganic material, or an organic insulating layer including organic material.

Thereafter, after an insulating material layer (not illustrated) is formed on the second insulating layer INS2, a mask (not illustrated) is disposed over the insulating material layer, and then the third insulating layer INS3 is formed by patterning the insulating material layer through a process using the mask.

The third insulating layer INS3 may cover the first contact electrode CNE1 and protect the first contact electrode CNE1 from the outside, and expose the third insulating pattern INSP3 on the second electrode REL2, the second end EP2 of each light emitting element LD, and the planarization layer PLL that comes into contact with at least a portion of the second end EP2.

Referring to FIGS. 1A to 10M, after a mask (not illustrated) is disposed over the passivation layer PSV including the third insulating layer INS3, the first insulating layer INS1 is formed by patterning the third insulating pattern INSP3 exposed to the outside.

The first insulating layer INS1 may expose at least one area of the capping layer CPL disposed on the second electrode REL2 to the outside and cover a remaining area other than the one area. If the capping layer CPL is not disposed, at least one area of the second electrode REL2 may be exposed outside the first insulating layer INS1.

Eventually, the first insulating layer INS1 may expose at least one area of the capping layer CPL on the first electrode REL1 and at least one area of the capping layer CPL on the second electrode REL2 to the outside.

Referring to FIGS. 1A to 10N, the second contact electrode CNE2 is formed using a sputtering method or the like on the exposed capping layer CPL, the second end EP2 of each light emitting element LD, and the planarization layer PLL that comes into contact with at least the portion of the second end EP2.

The second contact electrode CNE2 may be electrically and/or physically connected with the second electrode REL2 through the capping layer CPL.

The second contact electrode CNE2 may be directly formed on the planarization layer PLL and be electrically and/or physically connected to the second end EP2 of each light emitting element LD. In an embodiment of the present disclosure, since the second contact electrode CNE2 is formed on the second end EP2 successive to the lower surface LD1_b of each light emitting element LD that has a smooth step difference due to the planarization layer PLL, the second contact electrode CNE2 may have an overall uniform thickness. Hence, the step coverage of the second contact electrode CNE2 may be enhanced.

Referring to FIGS. 1A to 10O, the fourth insulating layer INS4 is formed on an overall surface of the passivation layer PSV including the second contact electrode CNE2.

The fourth insulating layer INS4 may include an inorganic insulating layer made of inorganic material, or an organic insulating layer made of organic material. Although the fourth insulating layer INS4 may have a single layer structure as shown in the drawing, the present disclosure is not limited thereto. For example, the fourth insulating layer INS4 may have a multi-layer structure.

Subsequently, the overcoat layer OC is formed on the fourth insulating layer INS4.

Figure 11:
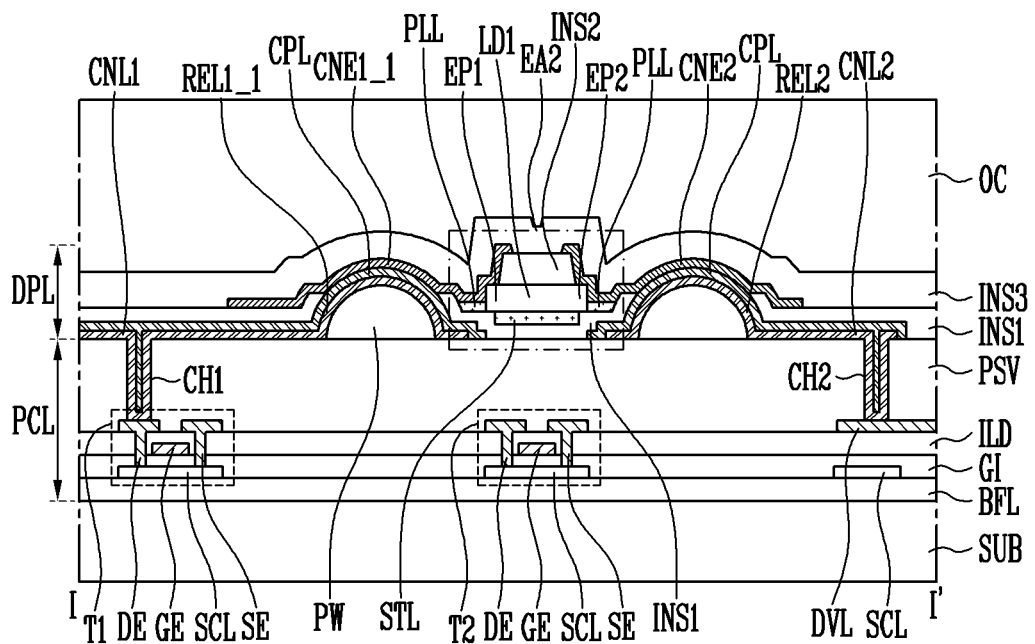
FIG. 11 schematically illustrates a display device in accordance with an embodiment of the present disclosure, and is a sectional view corresponding to line I-I' of FIG. 4B.
Figure 12:
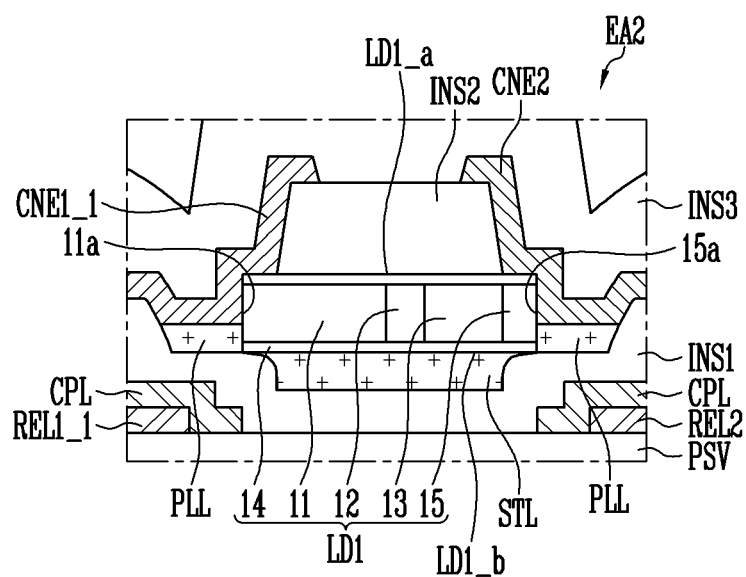
FIG. 12 is an enlarged sectional diagram of area EA2 of FIG. 11.

FIG. 11 schematically illustrates a display device in accordance with an embodiment of the present disclosure, and is a sectional view corresponding to line I-I' of FIG. 4B. FIG. 12 is an enlarged sectional view of area EA2 of FIG. 11.

The configuration of the display device illustrated in FIGS. 11 and 12, other than the fact that a first contact electrode and a second contact electrode are disposed on the same layer, may be substantially equal or similar to that of the display device of FIG. 5.

Therefore, to avoid redundant explanation, the description of the display device of FIGS. 11 and 12 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Although FIGS. 11 and 12 illustrate only one first light emitting element LD1 aligned between the 1-1th electrode REL1_1 and the second electrode REL2 among the light emitting elements LD, the one first light emitting element LD1 will be described as being a plurality of light emitting elements.

Moreover, although FIGS. 11 and 12 illustrate a simplified structure of the display device, e.g., showing that each electrode has only a single electrode layer, and each insulating layer has only a single insulating layer, the present disclosure is not limited thereto.

Referring to FIGS. 1A, 2, 4B, 11, and 12, the display device in accordance with an embodiment of the present disclosure may include a substrate SUB on which a plurality of pixels PXL are provided. Each of the pixels PXL may include first to third sub-pixels SP1, SP2, and SP3.

Each of the first to third sub-pixels SP1, SP2, and SP3 may include an emission area EMA which emits light, and a peripheral area PPA disposed around a perimeter of the emission area EMA. Each of the first to third sub-pixels SP1, SP2, and SP3 may include a pixel circuit layer PCL provided on the substrate SUB, and a display element layer DPL provided on the pixel circuit layer PCL.

The pixel circuit layer PCL of each of the first to third sub-pixels SP1, SP2, and SP3 may include first and second transistors T1 and T2 provided on the substrate SUB, and a passivation layer PSV including a driving voltage line DVL and first and second contact holes CH1 and CH2.

The display element layer DPL of each of the first to third sub-pixels SP1, SP2, and SP3 may include a partition wall PW, first and second connection lines CNL1 and CNL2, first and second electrodes REL1 and REL2, a capping layer CPL, a plurality of light emitting elements LD, and first and second contact electrodes CNE1 and CNE2. Furthermore, the display element layer DPL of each of the first to third sub-pixels SP1, SP2, and SP3 may further include a planarization layer PLL and a support layer STL.

The planarization layer PLL may be formed and/or provided on the first insulating layer INS1 such that the planarization layer PLL comes into contact with at least a portion of each of the opposite ends EP1 and EP2 of each light emitting element LD. The planarization layer PLL may be provided in the form of being charged into the lower surface LD1_b of each light emitting element LD that directly touches the first insulating layer INS1, and come into contact with each of at least a portion of the first sidewall 11a of the light emitting element LD and at least a portion of the second sidewall 15a thereof.

Since the planarization layer PLL is provided in the form of being charged into the lower surface LD1_b of each light emitting element LD, a step difference of the lower surface LD1_b due to the shape of the light emitting element LD may be mitigated, so that the junctions between the light emitting element LD and the first and second contact electrodes CNE1 and CNE2 can be planarized. Hence, the first and second contact electrodes CNE1 and CNE2 that are directly formed on the planarization layer PLL may have overall uniform thicknesses.

The support layer STL may be charged into space between the first insulating layer INS1 on the passivation layer PSV and the lower surface LD1_b of each light emitting element LD, thus stably fixing the light emitting element LD. The support layer STL and the planarization layer PLL may include the same material. For example, the support layer STL and the planarization layer PLL each may be formed of an organic insulating layer including organic material.

The first contact electrode CNE1 and the second contact electrode CNE2 each may be provided on a corresponding electrode and be electrically and/or physically connected to the corresponding electrode. For example, the first contact electrode CNE1 may be provided on the first electrode REL1 and electrically and/or physically connected with the first electrode REL1. The second contact electrode CNE2 may be provided on the second electrode REL2 and electrically and/or physically connected with the second electrode REL2. In detail, the first contact electrode CNE1 may be directly provided on the capping layer CPL on the first electrode REL1 and electrically and/or physically connected with the first electrode REL1 through the capping layer CPL. The second contact electrode CNE2 may be directly provided on the capping layer CPL on the second electrode REL2 and electrically and/or physically connected with the second electrode REL2 through the capping layer CPL.

In an embodiment of the present disclosure, the first contact electrode CNE1 and the second contact electrode CNE2 may be provided on the same surface, and may be spaced apart from each other by a predetermined distance on the second insulating layer INS2 and thus electrically and/or physically separated from each other. In other words, the first contact electrode CNE1 and the second contact electrode CNE2 may be provided on the same layer and formed through the same manufacturing process.

The third insulating layer INS3 for covering the first and second contact electrodes CNE1 and CNE2 may be provided on the first contact electrode CNE1 and the second contact electrode CNE2. The third insulating layer INS3 may correspond to the fourth insulating layer INS4 illustrated in FIG. 5. The third insulating layer INS3 may prevent the first and second contact electrodes CNE1 and CNE2 from being exposed to the outside, thus preventing the first and second contact electrodes CNE1 and CNE2 from being corroded.

An overcoat layer OC may be provided on the third insulating layer INS3.

As described above, the planarization layer PLL may be disposed between the first insulating layer INS1 and each light emitting element LD so that a step difference of the lower surface LD1_b of the light emitting element LD due to the shape of the light emitting element LD can be mitigated, and the thicknesses of the first and second contact electrodes CNE1 and CNE2 may be uniform.

While various exemplary embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims.

The invention claimed is:

1. A display device comprising:
a substrate comprising a display area and a non-display area; and
a plurality of pixels on the display area, each of the plurality of pixels comprising a plurality of sub-pixels, wherein each sub-pixel of the plurality of sub-pixels comprises an emission area and a non-emission area: a pixel circuit layer comprising at least one transistor; and a display element layer comprising at least one light emitting element connected to the at least one transistor to emit light,
wherein the display element layer further comprises:
a first electrode and a second electrode spaced apart from each other with the at least one light emitting element therebetween;
the at least one light emitting element disposed between the first electrode and the second electrode in a plan view; and
a planarization layer on the pixel circuit layer, and in direct contact with at least a portion of each of opposite ends of the at least one light emitting element,
wherein the planarization layer overlaps with each of the first electrode and the second electrode in a plan view.

2. The display device according to claim 1, wherein a width of the planarization layer is equal to or greater than a length of the light emitting element.

3. The display device according to claim 2, wherein the display element layer further comprises:
a first insulating layer to enclose a portion of each of the first electrode and the second electrode; and
a support layer on the first insulating layer, to support the at least one light emitting element.

4. The display device according to claim 3, wherein the support layer is to be inserted between a lower surface of the at least one light emitting element and the first insulating layer on a surface of the pixel circuit layer that faces the lower surface of the at least one light emitting element.

5. The display device according to claim 4, wherein the planarization layer and the support layer are integrally provided, and comprise an identical material.

6. The display device according to claim 5, wherein the planarization layer and the support layer each comprise an organic insulating layer including an organic material.

7. The display device according to claim 3, wherein the display element layer further comprises:
a second insulating layer on an upper surface of the at least one light emitting element;
a first contact electrode to connect any one end of the opposite ends of the at least one light emitting element with the first electrode; and
a second contact electrode to connect a remaining end of the opposite ends of the at least one light emitting element with the second electrode.

8. The display device according to claim 7, wherein the first contact electrode and the second contact electrode are on an identical layer, and are spaced apart from each other on the second insulating layer and electrically separated from each other.

9. The display device according to claim 7, wherein each of the first contact electrode and the second contact electrode is on the planarization layer and overlaps with the planarization layer.

10. The display device according to claim 9, wherein the display element layer further comprises:
a third insulating layer on the first contact electrode; and
a fourth insulating layer on the second contact electrode.

11. The display device according to claim 10, wherein the first contact electrode and the second contact electrode are on different layers and electrically separated from each other.

12. The display device according to claim 7, wherein the display element layer further comprises a capping layer respectively between the first electrode and the first contact electrode and between the second electrode and the second contact electrode.

13. The display device according to claim 12, wherein the first insulating layer exposes a portion of the capping layer on the first electrode so that the first electrode is electrically connected with the first contact electrode, and the first insulating layer exposes a portion of the capping layer on the second electrode so that the second electrode is electrically connected with the second contact electrode.

14. The display device according to claim 13, wherein the at least one light emitting element comprises a light emitting diode in a shape of a cylinder having a size of a micrometer scale or a nanometer scale.

15. A display device comprising:
a substrate comprising a display area and a non-display area; and
a plurality of pixels on the display area, each of the plurality of pixels comprising a plurality of sub-pixels,
wherein each sub-pixel of the plurality of sub-pixels comprises an emission area and a non-emission area: a pixel circuit layer comprising at least one transistor; and a display element layer comprising at least one light emitting element connected to the at least one transistor to emit light,
wherein the display element layer further comprises:
a first electrode and a second electrode spaced apart from each other with the at least one light emitting element therebetween;
the at least one light emitting element disposed between the first electrode and the second electrode in a plan view; and
a planarization layer on the pixel circuit layer, and in contact with at least a portion of each of opposite ends of the at least one light emitting element,
wherein the planarization layer overlaps with each of the first electrode and the second electrode in a plan view, and
wherein a height of the planarization layer is less than a diameter of the light emitting element, in a sectional view.

16. A method of fabricating a display device, the method comprising:
providing a substrate comprising a plurality of sub-pixels, each of the plurality of sub-pixels comprising an emission area and a non-emission area; and
forming, on the substrate, a display element layer to emit light from the emission area of each of the plurality of sub-pixels,
wherein the forming the display element layer comprises:
forming a first electrode and a second electrode spaced apart from each other in the emission area of each of the plurality of sub-pixels;
forming a first insulating material layer on the first electrode and the second electrode;
aligning a plurality of light emitting elements between the first electrode and the second electrode by respectively applying corresponding alignment voltages to the first electrode and the second electrode;
forming an insulating pattern for covering each of the plurality of light emitting element and a portion of the first insulating material layer by depositing a second insulating material layer on an overall surface of the substrate and then patterning the second insulating material layer;
forming, by removing a portion of the insulating pattern through an ashing process, a planarization layer on the first insulating material layer, the planarization layer overlapping the plurality of light emitting elements;
forming a second insulating layer for covering a portion of an upper surface of the plurality of light emitting elements; and
forming a first contact electrode and a second contact electrode on the substrate including the second insulating layer.

17. The method according to claim 16, further comprising, before the forming the first contact electrode and the second contact electrode, forming a first insulating layer by removing a portion of the first insulating material layer corresponding to the first electrode to expose the first electrode, and removing a portion of the first insulating material layer corresponding to the second electrode to expose the second electrode.

18. The method according to claim 17, wherein the planarization layer overlaps with each of the first electrode, the second electrode, and the plurality of light emitting elements, in a plan view.

19. The method according to claim 18, wherein the forming the planarization layer comprises forming a support layer to be inserted between a lower surface of the plurality of light emitting elements and the first insulating material layer.

20. The method according to claim 19, wherein the planarization layer and the support layer each comprise an organic insulating layer including an organic material.

* * * * *